United States Patent
Noda et al.

(10) Patent No.: US 6,229,833 B1
(45) Date of Patent: May 8, 2001

(54) LASER DIODE PROTECTING CIRCUIT AND LASER DRIVING CURRENT CONTROL CIRCUIT

(75) Inventors: Mitsuharu Noda, Kasuya-gun; Motoyoshi Sekiya, Kawasaki; Setsuo Misaizu, Yokohama; Tetsuya Kiyonaga, Kawasaki; Nobuaki Sato; Yasunori Nagakubo, both of Yokohama, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/274,248

(22) Filed: Mar. 23, 1999

Related U.S. Application Data

(63) Continuation-in-part of application No. 09/041,752, filed on Mar. 13, 1998, now Pat. No. 6,097,746.

(30) Foreign Application Priority Data

Oct. 16, 1997 (JP) ...................................... 9-283633
Jan. 11, 1999 (JP) .................................. 11-004233

(51) Int. Cl.[7] ...................................................... H01S 3/00
(52) U.S. Cl. ............................ 372/38.09; 372/31; 372/34
(58) Field of Search ........................... 372/31, 34, 38.09, 372/43

(56) References Cited

U.S. PATENT DOCUMENTS

| | | | |
|---|---|---|---|
| 4,789,987 | * 12/1988 | Fraser | 372/31 |
| 4,819,241 | * 4/1989 | Nagano | 372/26 X |
| 5,019,769 | * 5/1991 | Levinson | 372/31 |
| 5,268,916 | * 12/1993 | Slawson et al. | 372/26 X |
| 5,276,697 | * 1/1994 | Davis | 372/34 X |
| 5,488,621 | * 1/1996 | Slawson et al. | 372/31 |
| 6,097,746 | * 8/2000 | Noda et al. | 372/38.09 X |

FOREIGN PATENT DOCUMENTS 61-63074    4/1986  (JP) ................................ 372/38.09 X

* cited by examiner

Primary Examiner—Brian Healy
(74) Attorney, Agent, or Firm—Staas & Halsey LLP

(57) ABSTRACT

Disclosed is a laser diode protecting circuit adapted to prevent a laser diode from producing an excessive emission when the laser diode is driven at low temperature, thereby assuring that the laser diode will not be damaged or degraded in terms of its characteristic. When the laser diode is started at low temperature, a laser diode protecting circuit has a power monitor circuit for monitoring backward power of the laser diode and a laser diode current limiting circuit for limiting the laser diode current when the backward power becomes equal to the set power. When the laser diode temperature subsequently rises and the backward power falls below the set power, an automatic current control circuit performs automatic current control in such a manner that the laser diode current attains a set current value. Alternatively, a temperature monitor circuit monitors the temperature of the laser diode and the laser diode current limiting circuit limits the laser diode current when the monitored temperature of the laser diode is less than the set temperature. When the laser diode temperature exceeds the set temperature, the automatic current control circuit performs automatic current control in such a manner that the laser diode attains the set current value.

10 Claims, 27 Drawing Sheets

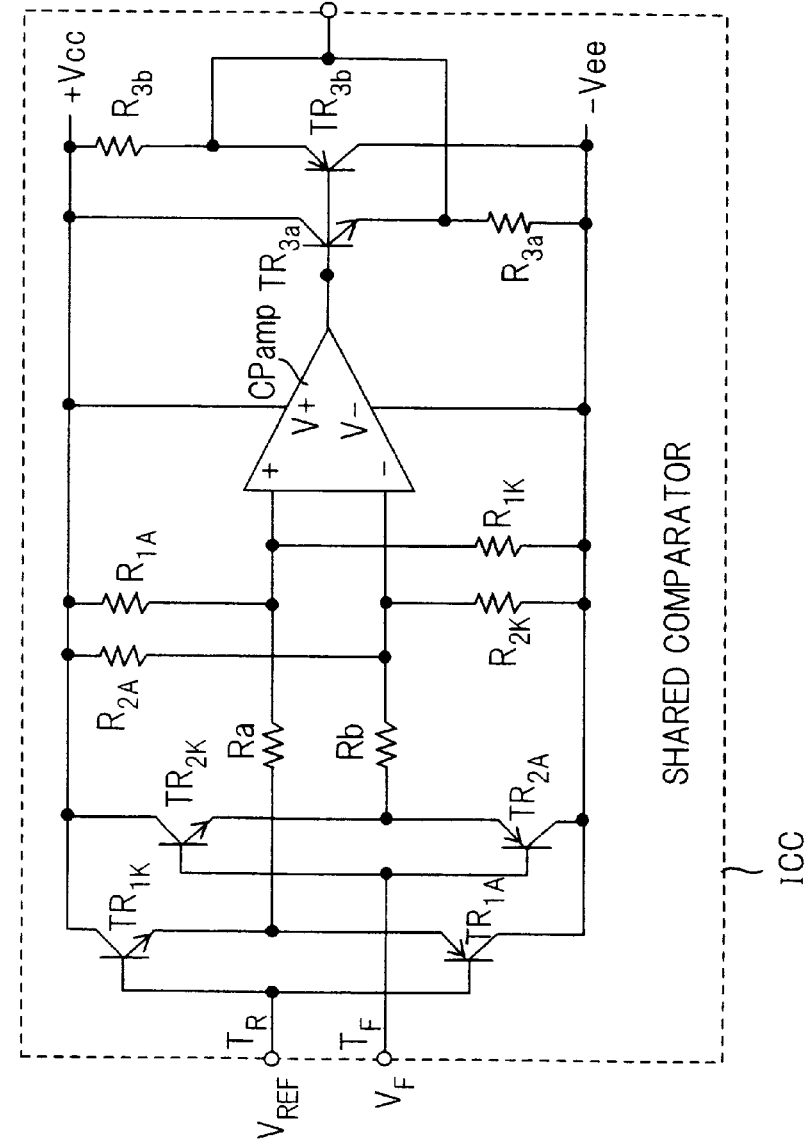
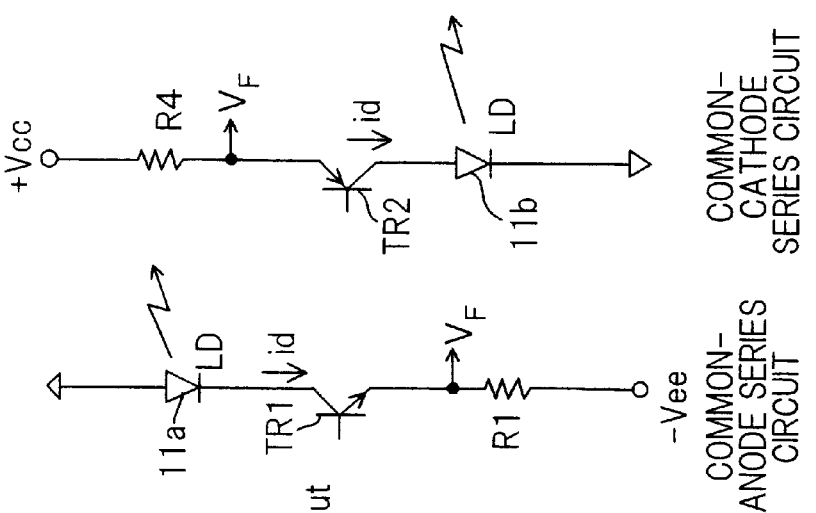
FIG.18A  FIG.18B  FIG.18C

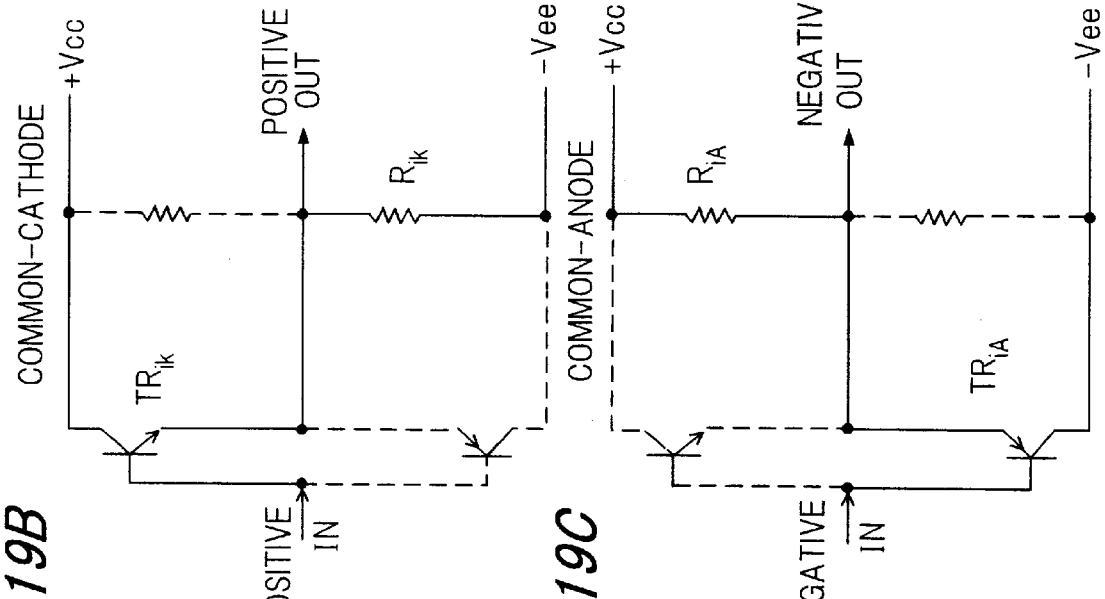
*FIG.19B*
*FIG.19C*
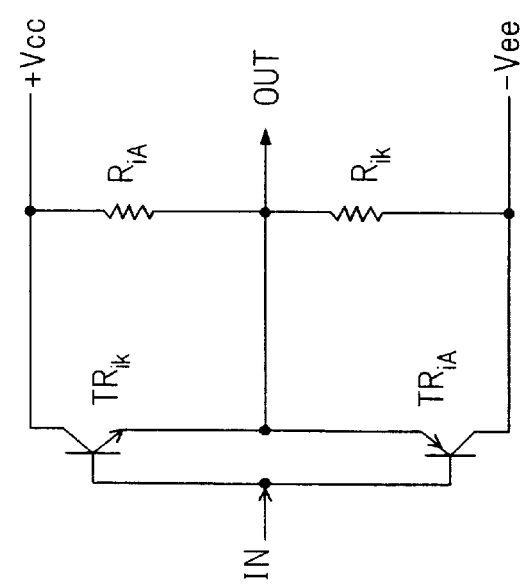
*FIG.19A*

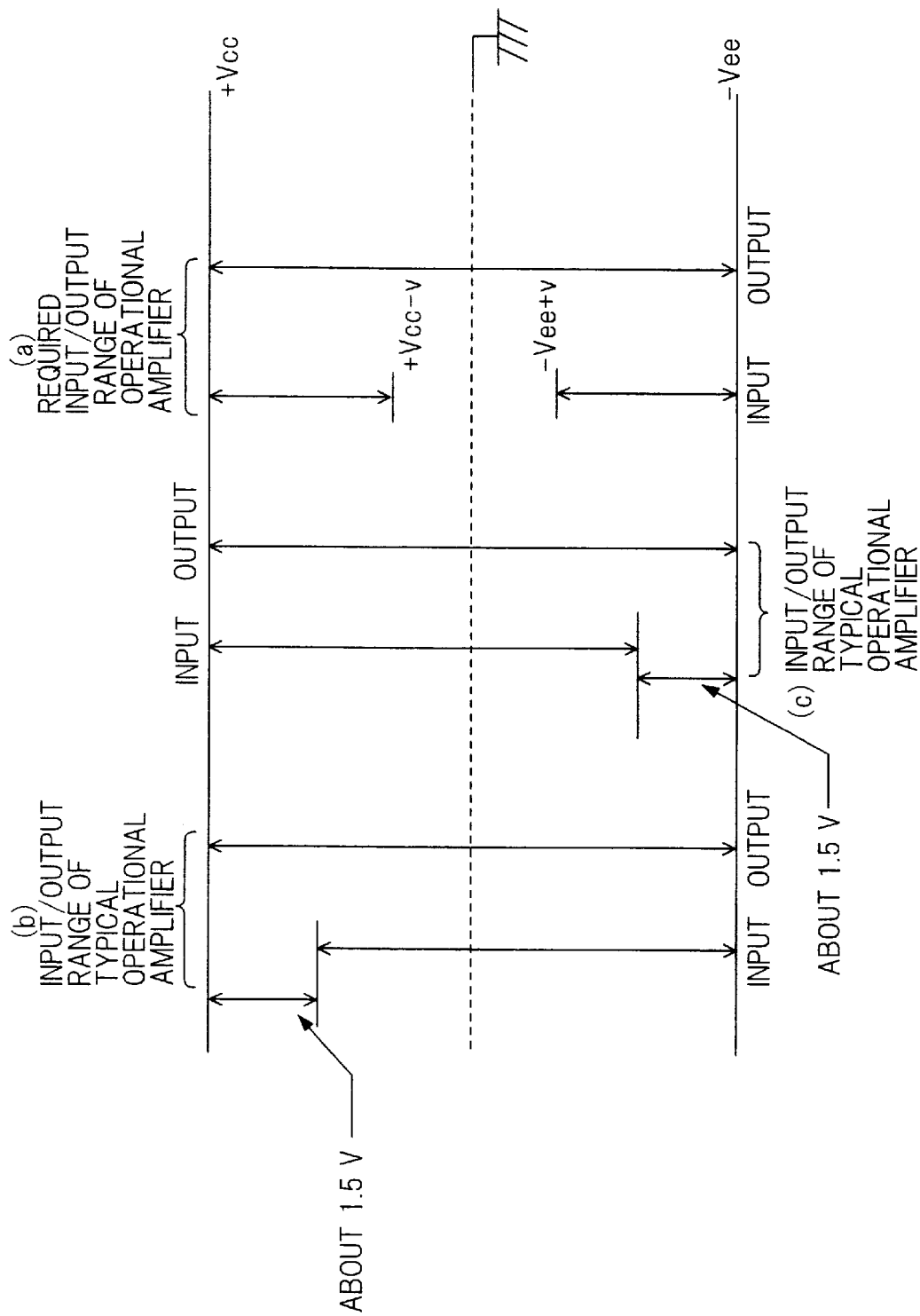

LASER DIODE PROTECTING CIRCUIT AND LASER DRIVING CURRENT CONTROL CIRCUIT

CROSS-REFERENCE TO RELATED APPLICATION

This application is a continuation-in-part of our application Ser. No. 09/041,752 filed on Mar. 13, 1998, now U.S. Pat. No. 6,097,746, the disclosure of which is hereby incorporated by reference.

BACKGROUND OF THE INVENTION

This invention relates a laser diode protecting circuit in a laser diode drive having an automatic current control circuit (ACC circuit) for performing control in such a manner that laser diode current attains a set value, as well as to a laser driving current control circuit in the above-mentioned ACC circuit. More particularly, the invention relates to a laser diode protecting circuit for protecting a laser diode by preventing an excessive emission from the laser diode when the laser diode is started up at low temperatures, as well as to a laser driving current control circuit applicable also to laser diodes of both the common-anode and common-cathode types.

A deterioration in transmission characteristics due to wavelength fluctuation (chirping) cannot be ignored in high-speed optical communications. In addition, wavelength stability is extremely important in wavelength division multiplexing. For these reasons the laser diode drive is constructed by combining an ACC circuit and an ATC (Automatic Temperature Control) circuit and control is performed in such a manner that the laser diode current will attain a constant current value and the laser diode chip temperature (laser diode temperature) a constant temperature.

FIGS. 24A, 24B are block diagrams illustrating optical transmitters used in digital optical communication, in which FIG. 24A shows an optical transmitter using a laser diode of the common-anode type, and FIG. 24B shows an optical transmitter using a laser diode of the common-cathode type. Numeral 1 in these Figures denotes a laser diode drive, 1a a common-anode laser diode and 1b a common-cathode laser diode. Also shown are an ACC circuit 2, which is constituted by an operational amplifier (OP amp) for performing control in such a manner that the laser diode current attains a set current value, an ATC circuit 3 for performing control in such a manner that the laser diode temperature attains a set value, optical fibers 4, 5, a D-type flip-flop (D-FF) 6 for storing a data signal DATA in response to a clock CLK, and a drive circuit (DRV) 7 for a light intensity modulator (IM) 8, which modulates light intensity in accordance with the "1", "0" logic of the data. The laser diodes are of common-anode type and common-cathode type, the driving currents of which have different directions. The laser diode 1a of common-anode type (FIG. 24A) has its anode connected to ground, and it is required that a driving current id be expelled from the laser diode 1a. The laser diode 1b of common-cathode type (FIG. 24B) has its cathode connected to ground, and it is required that a driving current id be drawn in by the laser diode 1b.

FIGS. 25A, 25B show examples of the ACC circuit 2, in which FIG. 25A shows an ACC circuit of common-anode type, and FIG. 25B shows an ACC circuit of common-cathode type.

In FIG. 25A, the laser diode (LD) of common-anode type is indicated at 1a. The ACC circuit includes resistors R1–R3 having resistance values $r_1$–$r_3$, respectively, a transistor TR1 and a comparator (current control circuit) IC1 constituted by an operational amplifier. The laser diode 1a, transistor TR1 and resistor R1 are serially connected and provided between ground and a negative power source −Vee. If id represents a current that flows through the laser diode 1a, then id·$r_1$ will enter the inverting input terminal of the comparator IC1. On the other hand, a reference voltage $V_{REF}$, obtained by voltage division by the resistors R2, R3, enters the non-inverting input terminal of the comparator IC1. The ACC circuit 2 brings the laser diode current id into line with the set current value by controlling the on/off operation of the transistor TR1 in such a manner that the terminal voltage id·$r_1$ across the resistor R1 becomes equal to the reference voltage $V_{REF}$. More specifically, the voltage $V_{REF}$ obtained by voltage division by the resistors R2, R3 becomes the voltage across the resistor R1 and a value obtained by dividing this voltage by the resistance value $r_1$ becomes the current id that flows through the laser diode 1a. In other words, the base of the transistor TR1 is controlled by the comparator IC1 in such a manner that the resistor R1 will serve as a constant-current source the current value of which will be $V_{REF}/r_1$ at all times, thereby making it possible to obtain a constant current value even when the temperature varies.

In FIG. 25B, the laser diode (LD) of common-cathode type is indicated at 1b. The ACC circuit includes resistors R4–R6 having resistance values $r_4$–$r_6$, respectively, a transistor TR2 and a comparator (current control circuit) IC2 constituted by an operational amplifier. The laser diode 1b, transistor TR2 and resistor R4 are serially connected and provided between ground and a positive power source +Vcc. If id represents a current that flows through the laser diode 1b, then id·$r_4$ will enter the inverting input terminal of the comparator IC2. On the other hand, a reference voltage $V_{REF}$, obtained by voltage division by the resistors R5, R6, enters the non-inverting input terminal of the comparator IC2. This ACC circuit brings the laser diode current id into line with the set current value by controlling the on/off operation of the transistor TR2 in such a manner that the terminal voltage id·$r_4$ across the resistor R4 becomes equal to the reference voltage $V_{REF}$. More specifically, the voltage $V_{REF}$ obtained by voltage division by the resistors R5, R6 becomes the voltage across the resistor R4 and a value obtained by dividing this voltage by the resistance value r4 becomes the current id that flows through the laser diode 1b. In other words, the base of the transistor TR2 is controlled by the comparator IC2 in such a manner that the resistor R4 will serve as a constant-current source the current value of which will be $V_{REF}/r_4$ at all times, thereby making it possible to obtain a constant current value even when the temperature varies.

FIG. 26 illustrates an example of the ATC circuit. The laser diode chip is shown at 1a. The ATC circuit includes a Peltier device 3a for heating or cooling the laser diode chip 1a depending upon the direction of the current, and a thermister 3b having a negative resistance characteristic for detecting the temperature of the laser diode chip 1a. The laser diode 1a, Peltier device 3a and thermister 3b are accommodated in a package 3c. The ATC circuit further includes resistors 3d, 3e, PNP, NPN transistors 3f, 3g and a comparator 3h. A voltage Vt (which conforms to the laser diode temperature) resulting from voltage division by the thermister 3b and resistor 3d is applied to the inverting input terminal of a comparator 3h, and a reference voltage $V_{REF}$ is applied to the non-inverting input terminal of the comparator 3h. The output terminal of the comparator is connected to the bases of transistors 3*f*, 3*g*. The emitter of the PNP transistor 3*f* is connected to V+, the emitter of the NPN transistor 3*g* is connected to V−, and the collectors of these transistors are connected to the Peltier device 3*a*.

When the laser diode chip is at a low temperature, the resistance of the thermister 3*b* increases, the voltage Vt decreases to establish the inequality Vt<Vref and the output of the comparator 3*h* becomes positive. As a result, the transistor 3*f* is turned off and the transistor 3*g* is turned on so that a current flows in a direction that causes the heating of the Peltier device 3*a*, thereby heating the interior of the package 3*c* and raising the temperature of the laser diode. When the temperature of the laser diode chip rises, the resistance of the thermister 3*b* decreases and the voltage Vt increases to establish the inequality Vt>Vref so that the output of the comparator 3*g* becomes negative. As a result, the transistor 3*f* is turned on and the transistor 3*g* is turned off so that a current flows in a direction that cools the Peltier device 3*a*, thereby lowering the temperature of the laser diode. The temperature of the laser diode is thus controlled so as to attain the set temperature.

When power is introduced to the optical transmitters of FIGS. 24A and 24B at low temperatures to drive the laser diodes 1*a*, 1*b*, the laser diode emits radiation excessively and the laser diode itself may be damaged. The reason for the excessive emission is as follows: The laser diode has a temperature characteristic of the kind shown in FIG. 27. It will be understood that the lower the temperature, the greater the power P needed to pass a constant laser diode current. If ACC stabilization time at which the laser diode current attains the set value by ACC is compared with stabilization at which the laser diode temperature attains the set value by ATC, it will be seen that ATC stabilization time is longer than ACC stabilization time. Consequently, when the laser diode is driven by introducing power at low temperature, as shown in FIG. 28 the laser diode current attains the set value by ACC before the laser diode chip attains the fixed temperature owing to the delay involved in ATC, as a result of which the power of the emission from the laser diode increases and becomes so excessive as to degrade the characteristic of the laser diode and eventually destroy the same. In other words, though the laser diode current attains the target value owing to the ACC circuit, the laser diode temperature does not attain its target value. Accordingly, the laser diode produces an emission in excess of the target value. It is necessary to prevent the excessive emission from the laser diode at low driving temperatures so that the laser diode will not be destroyed or suffer degradation of its characteristics.

Further, the laser diodes are of the common-anode and common-cathode types, as mentioned above, the comparators (current control circuits) IC1, IC2 used in the respective ACC circuits (see FIGS. 25A, 25B) are different and they must be designed and provided separately. It would be advantageous, therefore, if the ACC circuits of each type could make common use of a current control circuit, and a reduction in cost can be achieved by making common use of the current control circuits (i.e., by using LSI techniques).

The minimum value of laser current id controlled by the ACC circuit is 0 mA. This specification stipulating a minimum value of 0 mA is necessary for implementing a shut-down function, namely a function for halting completely the emission of laser light necessary for an optical transmitter. Consequently, it is required that the ACC circuits of both types perform control in such a manner that the voltage produced across the resistors R1, R4 is made 0 V, resulting in that it is required that the range of input voltages of the operational amplifier of the shared comparator (current control circuit) include the positive and negative power-source voltage values (+Vcc, −Vee). In other words, if v represents the terminal voltage of the resistors R1, R4 produced by the laser current id at the time of an ordinary emission, it is required that the operational amplifier of the shared comparator (current control circuit) operates at least at an input voltage within the voltage range of +Vcc to (+Vcc−v) or −Vee to (−Vee+v) shown at (a) of FIG. 29. This input voltage range can be relaxed to some extent by enlarging the resistance values $r_1$, $r_4$ of the resistors R1, R4, respectively. However, when such factors as a reduction in the voltage of the circuit power source and the maximum value of controllable current are taken into consideration, it is desired that the resistance values $r_1$, $r_4$ be several ohms to several tens of ohms. Hence, there is a limitation on how large $r_1$, $r_4$ can be made.

The input voltage range of a typical operational amplifier is −Vee to (+Vcc−1.5) or (−Vee+1.5) to +Vcc, as shown at (b) or (c) of FIG. 29. The operational amplifier cannot operate when a signal within a range of about 1.5 V from the +Vcc or −Vee of power supply level is input to the amplifier. This is a characteristic that inevitably accompanies an operational amplifier constituted by a differential pair. That is, with a typical operational amplifier, it is difficult to obtain an input voltage range [the voltage range shown at (a) of FIG. 29] in the vicinity of both power source voltages required for the operational amplifier of the shared comparator (current control circuit).

SUMMARY OF THE INVENTION

Accordingly, an object of the present invention is to prevent an excessive emission from a laser diode when the laser diode is driven at low temperature, thereby assuring that damage to the laser diode and deterioration of its characteristics will not occur.

Another object of the present invention is to monitor emission power (backward power) of a laser diode to prevent an excessive emission from a laser diode when the laser diode is driven at low temperature, thereby assuring that damage to the laser diode and deterioration of its characteristics will not occur.

Another object of the present invention is to monitor the temperature of a laser-diode chip to prevent an excessive emission from a laser diode when the laser diode is driven at low temperature, thereby assuring that damage to the laser diode and deterioration of its characteristics will not occur.

A further object of the present invention is to monitor time that elapses from introduction of power to prevent an excessive emission from a laser diode when the laser diode is driven at low temperature, thereby assuring that damage to the laser diode and deterioration of its characteristics will not occur.

Yet another object of the present invention is to make possible the common use of a comparator (current control circuit) employed in ACC circuits of both the common-anode and common-cathode types.

Yet another object of the present invention is to arrange it so that a laser diode protecting circuit for preventing an excessive emission from a laser diode can be used commonly for laser diodes of both the common-anode and common-cathode types.

In accordance with the present invention, the foregoing objects are attained by providing a laser diode protecting circuit of a laser diode drive having an automatic current control circuit for performing control in such a manner that laser diode current attains a set current value, comprising a power monitor circuit for monitoring emission power of a laser diode, and a laser diode current limiting circuit for halting automatic current control to limit laser diode current when the emission power exceeds a set value, and restoring automatic current control to make the laser diode current equal to the set current value when the emission power falls below the set value.

Further, in accordance with the present invention, the following objects are attained by providing a laser diode protecting circuit of a laser diode drive having an automatic current control circuit for performing control in such a manner that laser diode current attains a set current value, comprising a temperature monitor circuit for monitoring temperature of a laser diode, and a laser diode current limiting circuit for halting automatic current control to limit laser diode current when the temperature of the laser diode is less than a set temperature, and restoring automatic current control to make the laser diode current equal to the set current value when the temperature of the laser diode is greater than the set temperature.

Further, in accordance with the present invention, the following objects are attained by providing a laser diode protecting circuit of a laser diode drive having an automatic current control circuit for performing control in such a manner that laser diode current attains a set current value, comprising an elapsed-time monitor circuit for monitoring time that elapses from introduction of power, and a laser diode current limiting circuit for halting automatic current control to limit laser diode current when the time that elapses from introduction of power has not attained a set time, and restoring automatic current control to make the laser diode current equal to the set current value when the time that elapses from introduction of power has attained the set time.

Further, in accordance with the present invention, the foregoing objects are attained by constructing an automatic current control circuit of a laser diode drive in such a manner that the circuit can be used commonly in laser diodes of both the common-anode and common-cathode types.

Further, in accordance with the present invention, the foregoing objects are attained by constructing a laser diode current limiting circuit, which prevents an excessive emission from a laser diode, in such a manner that the circuit can be used commonly in laser diodes of both the common-anode and common-cathode types.

Other features and advantages of the present invention will be apparent from the following description taken in conjunction with the accompanying drawings.

BRIEF DESCRIPTION OF THE DRAWINGS

FIGS. 18A, 18B and 18C are circuit diagrams showing laser driving current control circuits (shared comparators);

FIGS. 19A, 19B and 19C are diagrams useful in describing the operation of a complementary emitter follower;

FIG. 29 is a diagram useful in describing input voltage range of an operational amplifier common use of which can be made in controlling the current of laser diodes of common-anode and common-cathode types.

DESCRIPTION OF THE PREFERRED EMBODIMENTS (A) Principles of the Present Invention (a) First principle of the present invention FIG. 1 is a block diagram useful in describing a first principle according to the present invention. Shown in FIG. 1 is a laser diode (LD) 11, an ACC circuit 12 for performing control in such a manner that the laser diode current attains a set current value, an ATC circuit 13 for performing control in such a manner that the laser diode temperature is rendered constant, an optical fiber 14, and a power monitor circuit 15 for monitoring emission power of the laser diode 11. The power monitor circuit 15 detects the backward power (BP) of the laser diode as the emission power thereof. A laser diode current limiting circuit 16 limits the current of the laser diode when the emission power exceeds a set power and includes a reference voltage generator 16a for outputting a reference voltage Vr conforming to set power, and a comparator 16b for comparing a voltage Vp, which conforms to detected emission power, with the reference voltage Vr. Though not shown, a comparator (current control circuit) designed to be sharable by laser diodes of both common-anode and common-cathode types is used in the ACC circuit 12.

When the laser diode is driven at low temperature and the laser diode current increases and approaches the set current value under ACC before the set temperature is attained owing to the lag associated with ATC, the emission power of the laser diode rises. When the emission power rises and surpasses the set power, the laser diode current limiting circuit 16 causes the ACC circuit 12 to halt ACC and limit the laser diode current, thereby preventing an excessive emission from the laser diode. If the temperature rises and the emission power of the laser diode falls below the set power owing to ATC under these conditions, the laser diode current limiting circuit 16 restores the ACC function of the ACC circuit 12 so that the laser diode current attains the set current value. As a result of the foregoing operation, the emission power (backward power) of the laser diode is monitored and excessive emission from the laser diode when the diode is driven at low temperatures is prevented so that the laser diode will not be damaged or sustain a deterioration in characteristics.

Further, the laser diode current limiting circuit 16 for preventing the excessive emission from the laser diode is constructed so as to be sharable by laser diodes of both common-anode and common-cathode types. For example, when emission power is greater than a set value, (1) laser diode current is limited by causing current to flow into the ACC circuit 12 from the laser diode current limiting circuit 16 if the diode is of the common-anode type, and (2) laser diode current is limited by causing current that is to flow into the laser diode to flow to the outside from the ACC circuit 12.

(b) Second principle of the present invention

Figure 1:
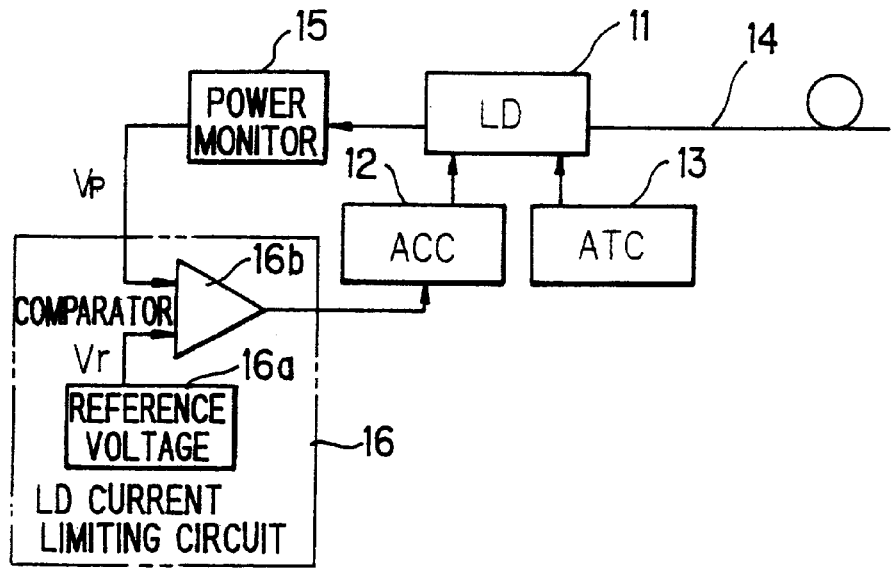
FIG. 1 is a block diagram useful in describing a first principle according to the present invention.
Figure 2:
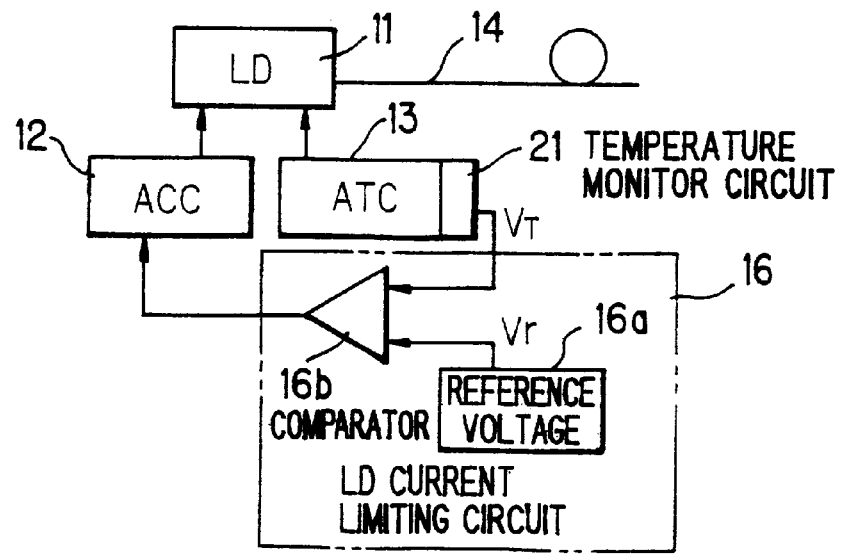
FIG. 2 is a block diagram useful in describing a second principle according to the present invention.

FIG. 2 is a block diagram useful in describing a second principle according to the present invention. Shown in FIG. 1 is the laser diode (LD) 11, the ACC circuit 12 for performing control in such a manner that the laser diode current attains a set current value, the ATC circuit 13 for performing control in such a manner that the laser diode temperature is rendered constant, the optical fiber 14, the laser diode current limiting circuit 16 for limiting the laser diode current when the laser diode temperature falls below the set temperature, and a temperature monitoring circuit 21 for monitoring the temperature of the laser diode chip. The laser diode current limiting circuit 16 includes the reference voltage generator 16a for outputting a reference voltage Vr conforming to set power, and the comparator 16b for comparing a voltage $V_T$, which conforms to detected temperature, with the reference voltage Vr. Though not shown, a comparator (current control circuit) designed to be sharable by laser diodes of both common-anode and common-cathode types is used in the ACC circuit 12.

When the laser diode is driven at low temperatures, the temperature of the laser diode initially is less than the set temperature. Consequently, the laser diode current limiting circuit 16 causes the ACC circuit 12 to halt ACC and limit the laser diode current, thereby preventing an excessive emission from the laser diode at low temperatures. If the temperature of the laser diode rises and exceeds the set temperature owing to ATC under these conditions, the laser diode 11 will not emit light excessively even though the laser diode current increases. The limiting circuit 16, therefore, restores the ACC function of the ACC circuit 12 so that the laser diode current attains the set current value. As a result of the foregoing operation, the laser diode temperature is monitored and excessive emission from the laser diode when the diode is driven at low temperatures is prevented so that the laser diode will not be damaged or sustain a deterioration in characteristics.

Further, the laser diode current limiting circuit 16 for preventing the excessive emission from the laser diode is constructed so as to be sharable by laser diodes of both common-anode and common-cathode types. For example, when laser diode temperature is less than a set value, (1) laser diode current is limited by causing current to flow into the ACC circuit 12 from the laser diode current limiting circuit 16 if the diode is of the common-anode type, and (2) laser diode current is limited by causing current that is to flow into the laser diode to flow to the outside from the ACC circuit 12.

(c) Third principle of the present invention

Figure 3:
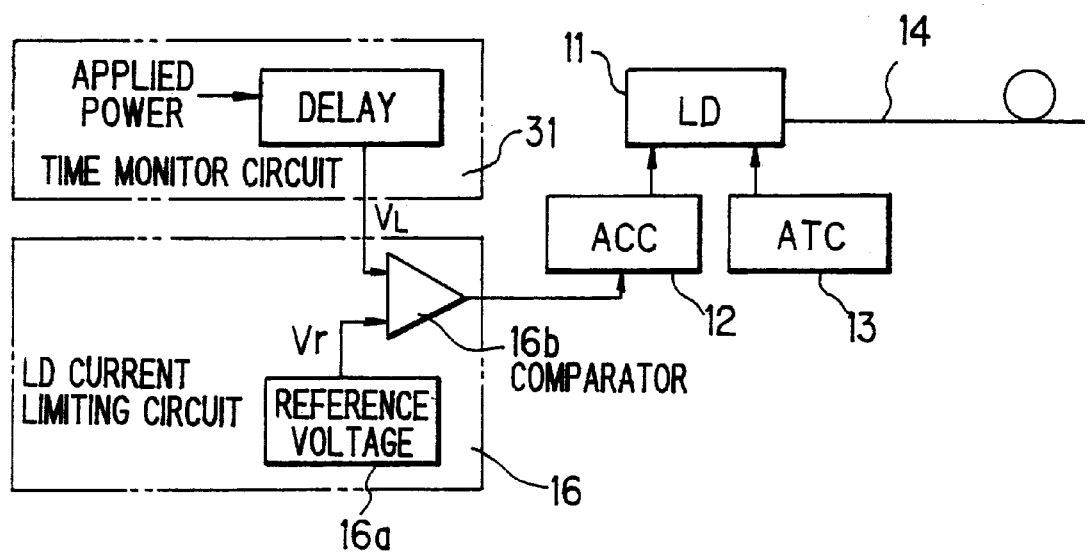
FIG. 3 is a block diagram useful in describing a third principle according to the present invention.

FIG. 3 is a block diagram useful in describing a third principle according to the present invention. Shown in FIG. 3 is the laser diode (LD) 11, the ACC circuit 12 for performing control in such a manner that the laser diode current attains a set current value, the ATC circuit 13 for performing control in such a manner that the laser diode temperature is rendered constant, the optical fiber 14, the laser diode current limiting circuit 16 for halting ACC to limit the laser diode current when time that elapses from introduction of power reaches a set time, and an elapsed-time monitor circuit 31 for monitoring time that elapses from introduction of power. For example, the elapsed-time monitor circuit 31 is constituted by a delay circuit (integrator circuit) in which output voltage $V_L$ increases as time elapses from the moment power is introduced. The laser diode current limiting circuit 16 includes the reference voltage generator 16a for outputting a reference voltage Vr conforming to set time, and the comparator 16b for comparing the voltage $V_L$, which conforms to the aforementioned elapsed time, with the reference voltage Vr. Though not shown, a comparator (current control circuit) designed to be sharable by laser diodes of both common-anode and common-cathode types is used in the ACC circuit 12.

The laser diode current limiting circuit 16 halts ACC to limit the laser diode current until the elapsed time from introduction of power reaches the set value, thereby preventing an excessive emission from the laser diode. When the elapsed time surpasses the set time, the temperature rises owing to ATC and the laser diode 11 will not emit light excessively even though the laser diode current increases. The limiting circuit 16, therefore, restores the ACC function of the ACC circuit 12 so that the laser diode current is regulated to the set value. As a result of the foregoing operation, elapsed time from introduction of power is monitored and excessive emission from the laser diode when the diode is driven at low temperatures is prevented so that the laser diode will not be damaged or sustain a deterioration in characteristics.

Further, the laser diode current limiting circuit 16 for preventing the excessive emission from the laser diode is constructed so as to be sharable by laser diodes of both common-anode and common-cathode types. For example, when elapsed time following introduction of power has not attained a set time, (1) laser diode current is limited by causing current to flow into the ACC circuit 12 from the laser diode current limiting circuit 16 if the diode is of the common-anode type, and (2) laser diode current is limited by causing current that is to flow into the laser diode to flow to the outside from the ACC circuit 12.

Figure 4:
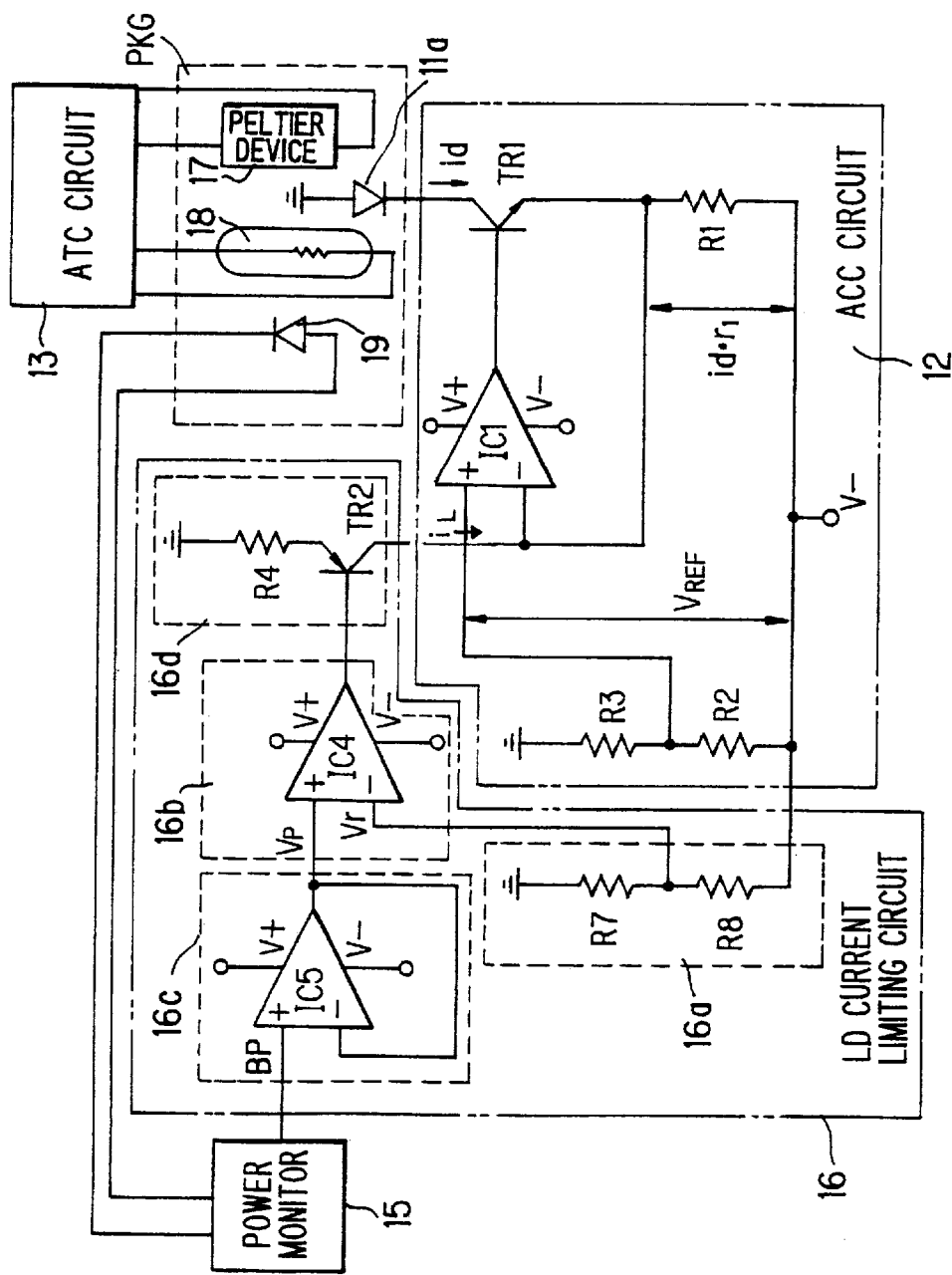
FIG. 4 is a diagram showing a first embodiment in which excessive emission is prevented by detecting emission power.

(B) Embodiments for Preventing Excessive Emission by detecting emission power (a) First embodiment FIG. 4 is a diagram showing the construction of a first embodiment in which excessive emission is prevented by detecting emission power (backward power) of the laser diode. Components identical with those shown in FIG. 1 are designated by identical reference characters. The laser diode (LD) 11a of common-anode type is housed in a package PKG along with a Peltier device 17, a thermister 18 for detecting the temperature of the laser diode chip and a PIN photodiode 19 for detecting the backward power (optical intensity) of the laser diode.

The ACC circuit 12, which is for performing control in such a manner that the laser diode current will attain the set current value, has a construction identical with that of the ACC circuit shown in FIG. 25A and is connected to a current source 16d (described later) that passes a current into the resistor R1. If the backward power is less than the set power, there is no inflow of current from the current source 16d and therefore the ACC circuit 12 performs ACC in such a manner that the laser diode current id attains the set current value. If the backward power is greater than the set power, on the other hand, current flows into the resistor R1 from the current source 16d. Consequently, the ACC circuit 12 halts the ACC function and reduces the laser diode current id by an amount commensurate with the amount of current inflow, thereby limiting the current value of the laser diode.

Figure 26:
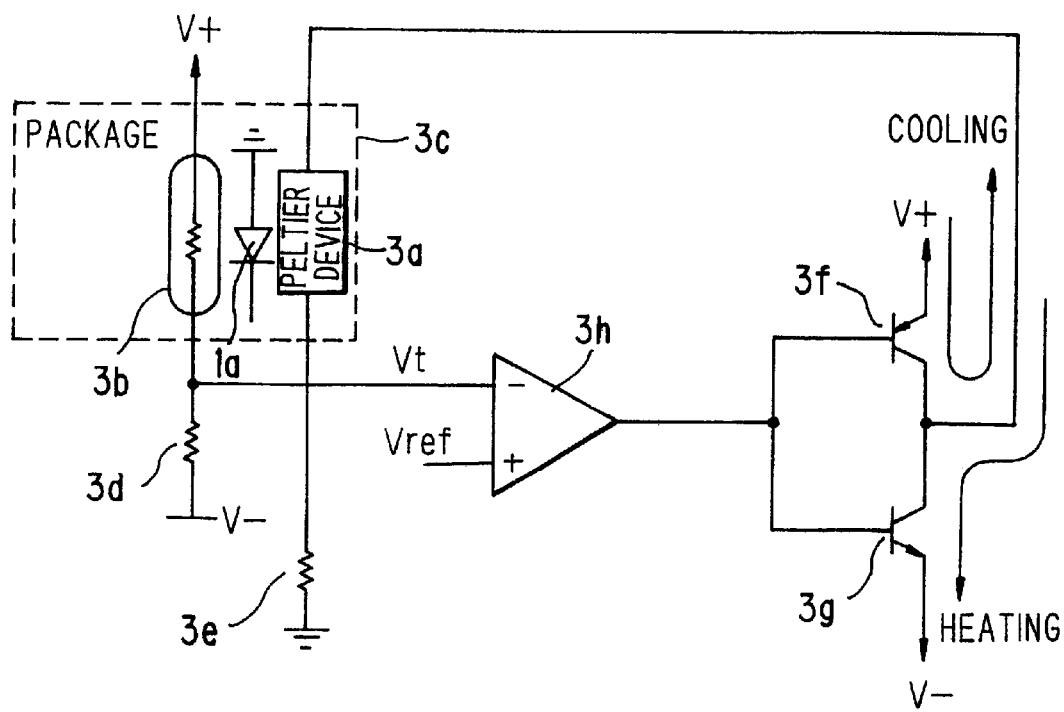
FIG. 26 is a diagram showing an example of an ATC circuit.
Figure 27:
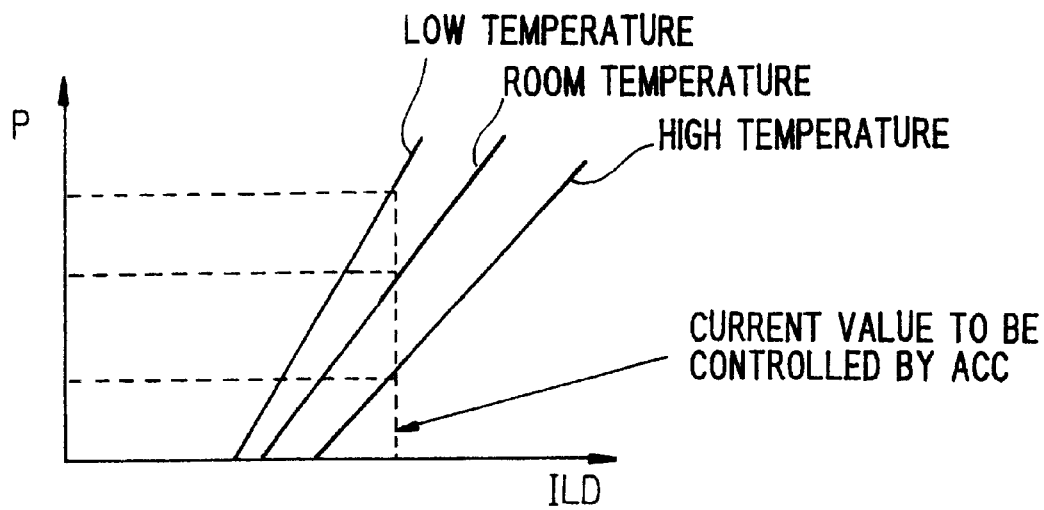
FIG. 27 is a diagram useful in describing the temperature characteristic of a laser diode.
Figure 28:
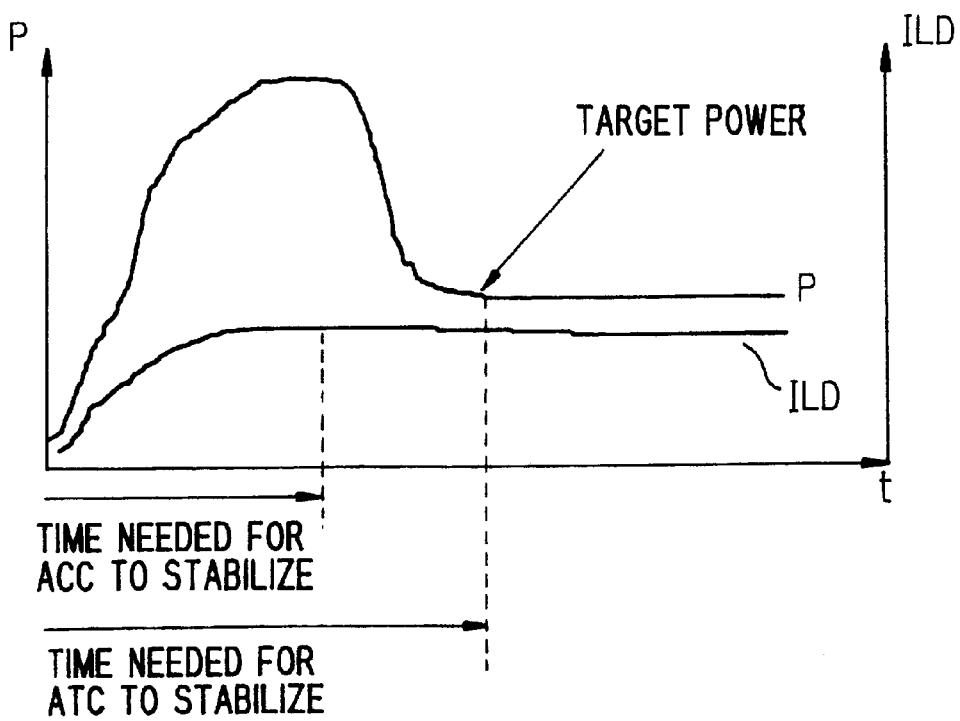
FIG. 28 is a diagram useful in describing the operation of a laser diode at low-temperature start-up.

The ATC circuit 13, which performs control in such a manner that the laser diode temperature is rendered constant, has a construction identical with that of the ATC circuit shown in FIG. 26. The power monitor circuit 15 uses the PIN photodiode 19 to output a voltage signal (referred to as a "backward power monitor signal BP") conforming to backward power. The laser diode current limiting circuit 16 limits the laser diode current when backward power exceeds the set power.

The laser diode current limiting circuit 16 includes the reference voltage generator 16a for outputting the reference voltage Vr through voltage division by resistors R7, R8, the comparator 16b constituted by an operational amplifier for comparing the voltage Vp dependent upon detected emission power (the larger the detected power, the smaller the voltage Vp) with the reference voltage Vr, a voltage follower circuit 16c and the current source 16d. The current source 16d has a transistor TR2 that turns on when the backward power is greater than the set power (i.e., when Vp<Vr holds) and turns off when the backward power is less than the set power (i.e., when Vp≧Vr holds), and a resistor R4 connected across the collector of transistor TR2 and ground. The emitter of the transistor TR2 is connected to the resistor R1 of ACC circuit 12.

By utilizing the fact that the forward power of the laser diode and the backward power BP of the laser diode are proportionally related, the reference voltage Vr is set in advance so as to attain a backward power monitor signal voltage corresponding to that which would prevail when the forward power is some multiple of the usual value.

When power is introduced to the laser diode drive circuit at low temperatures in the arrangement described above, the voltage Vp of the backward power monitor signal BP is smaller than the reference voltage Vr (Vp<Vr) during the time that temperature of the laser diode is stabilizing. The output of the comparator 16b declines until the transistor TR2 turns on. As a result, the voltage across the resistor R1 of the ACC circuit 12 is decided by the collector current (the limit current) $i_L$ of transistor TR2 and the laser diode current id decreases. In other words, when the backward power (the emission power) increases and the voltage value Vp of the backward power monitor signal BP becomes smaller than the reference voltage Vr (i.e., when the laser diode 11a is about to emit excessively), the transistor TR2 turns on and the laser diode current id is limited to establish the relation Vp=Vr, thereby preventing the excessive emission.

Figure 5:
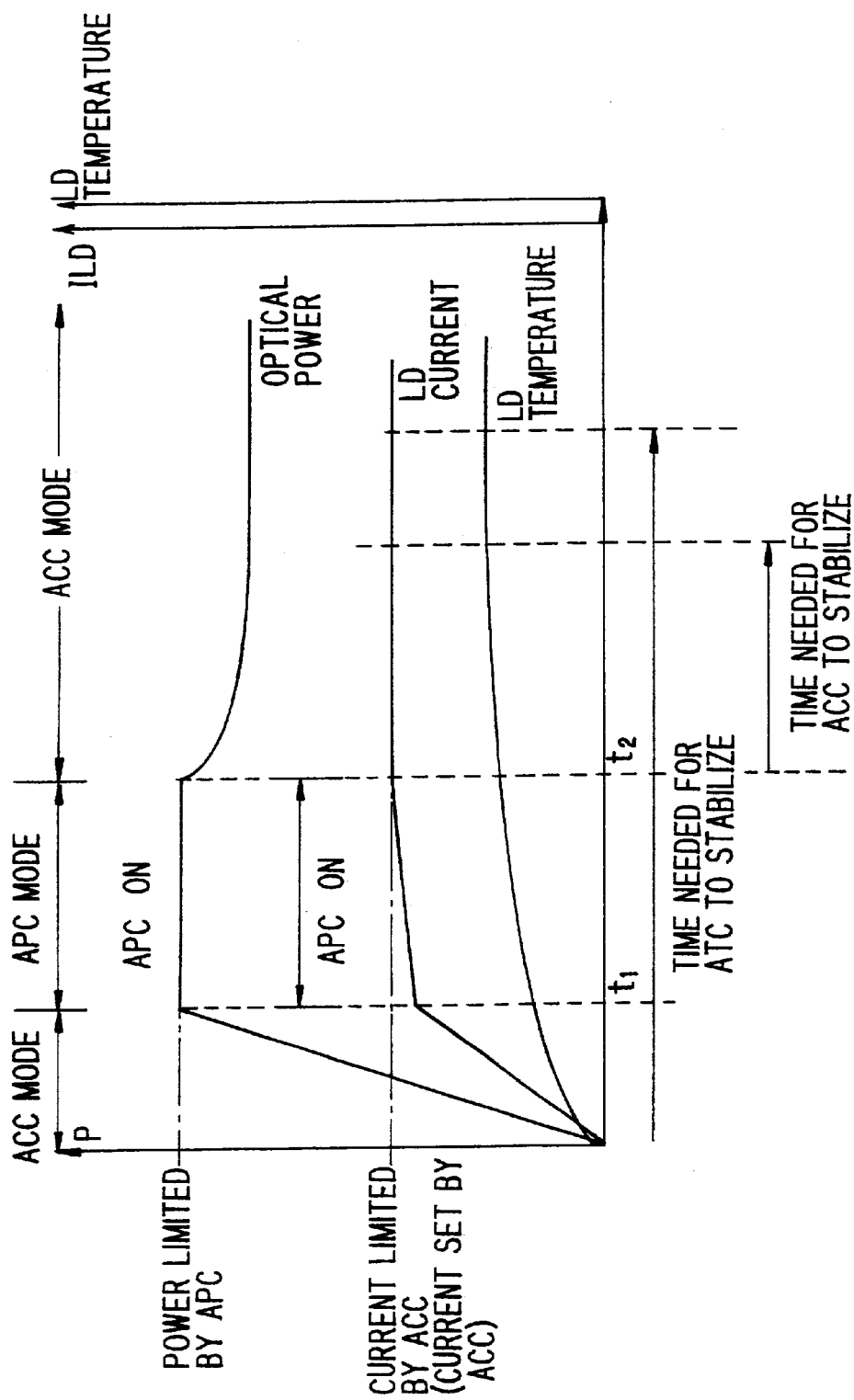
FIG. 5 is a diagram useful in describing operation according to the first embodiment when a laser diode is started up at low temperature.

The operation described above is such that when the laser diode is driven at low temperatures, the laser diode current takes on a large value under ACC before the laser diode temperature rises to the target temperature under ATC, as shown in FIG. 5. As a result, when the laser diode 11a is about to emit light excessively (time $t_1$), the laser diode drive circuit functions in such a manner that the emission power is rendered constant. This is the APC (Automatic Power Control) mode. When the temperature of the laser diode 11a subsequently stabilizes at the set temperature owing to ATC (time $t_2$), the voltage Vp of the backward power monitor signal BP becomes higher than the reference voltage Vr. Consequently, the output of the comparator 16b rises and the transistor TR2 of the current source 16d turns off. As a result, the ACC circuit 12 restores the ACC function and performs control in such a manner that the laser diode current id takes on a current value determined by the resistance ratio of the resistors R2, R3. This is the ACC mode.

This circuit arrangement is advantageous in that it functions to prevent an excessive emission from the laser diode in a case where power is introduced at low temperature and, at the same time, can be employed as an APC circuit as well when it is used with the transistor TR2 in the ON state at times.

(b) Modification

Figure 6A:
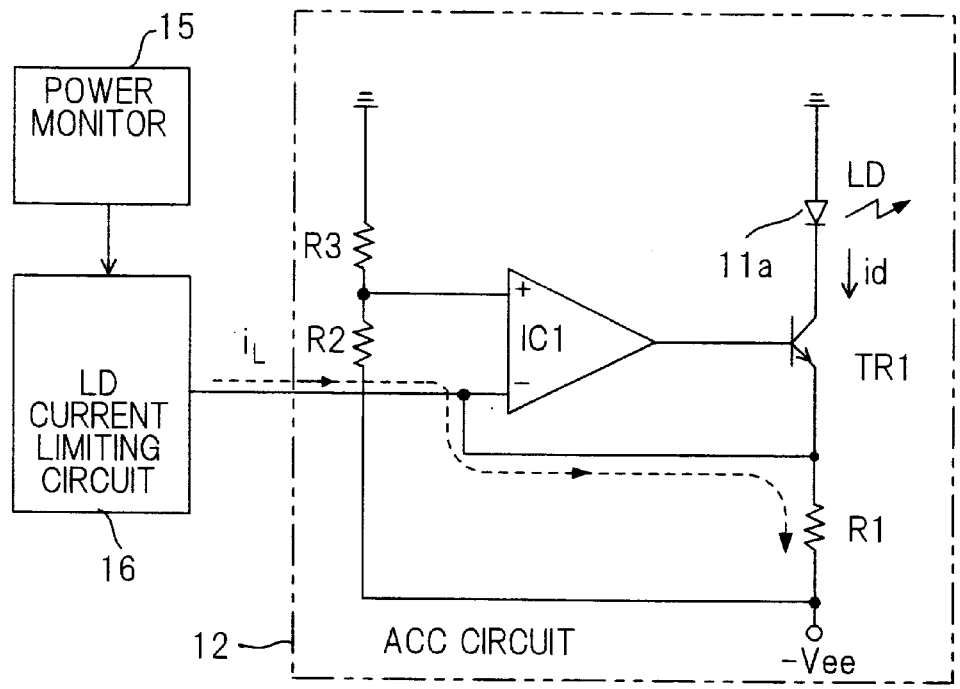
FIGS. 6A, 6B are diagrams showing arrangements of common-anode type and common-cathode type in a first embodiment for preventing excessive emission by detecting emission power.
Figure 6B:
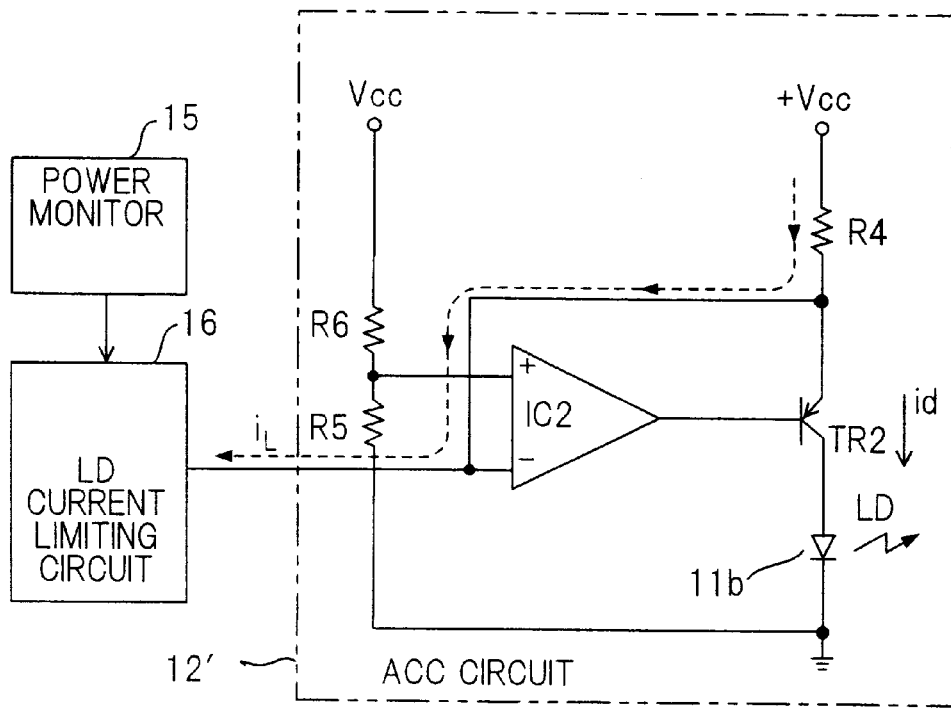

Though a common-anode laser diode is used in the first embodiment of FIG. 4, it is also possible to adopt an arrangement using a common-cathode laser diode. FIGS. 6A, 6B are diagrams showing arrangements of common-anode type and common-cathode type for preventing excessive emission by detecting emission power. FIG. 6A is a diagram showing the arrangement of common-anode type, and FIG. 6B is a diagram showing the arrangement of common-cathode type. Shown in these Figures are an ACC circuit 12 of common-anode type and an ACC circuit 12' of common-cathode type, the constructions of which are illustrated in FIGS. 25A and 25B, respectively. Numeral 15 denotes the power monitor and 16 the laser diode current limiting circuit.

With the ACC circuit 12 of common-anode type, the limit current $i_L$ is passed into the resistor R1, thereby enlarging the terminal voltage of the resistor R1 and limiting the laser diode current id. With the ACC circuit 12' of common-cathode type, on the other hand, the laser current id is limited by causing some of the current (the limit current $i_L$) that flows through the resistor R4 to flow to the outside without passing through the laser diode.

(c) Second embodiment

Figure 7:
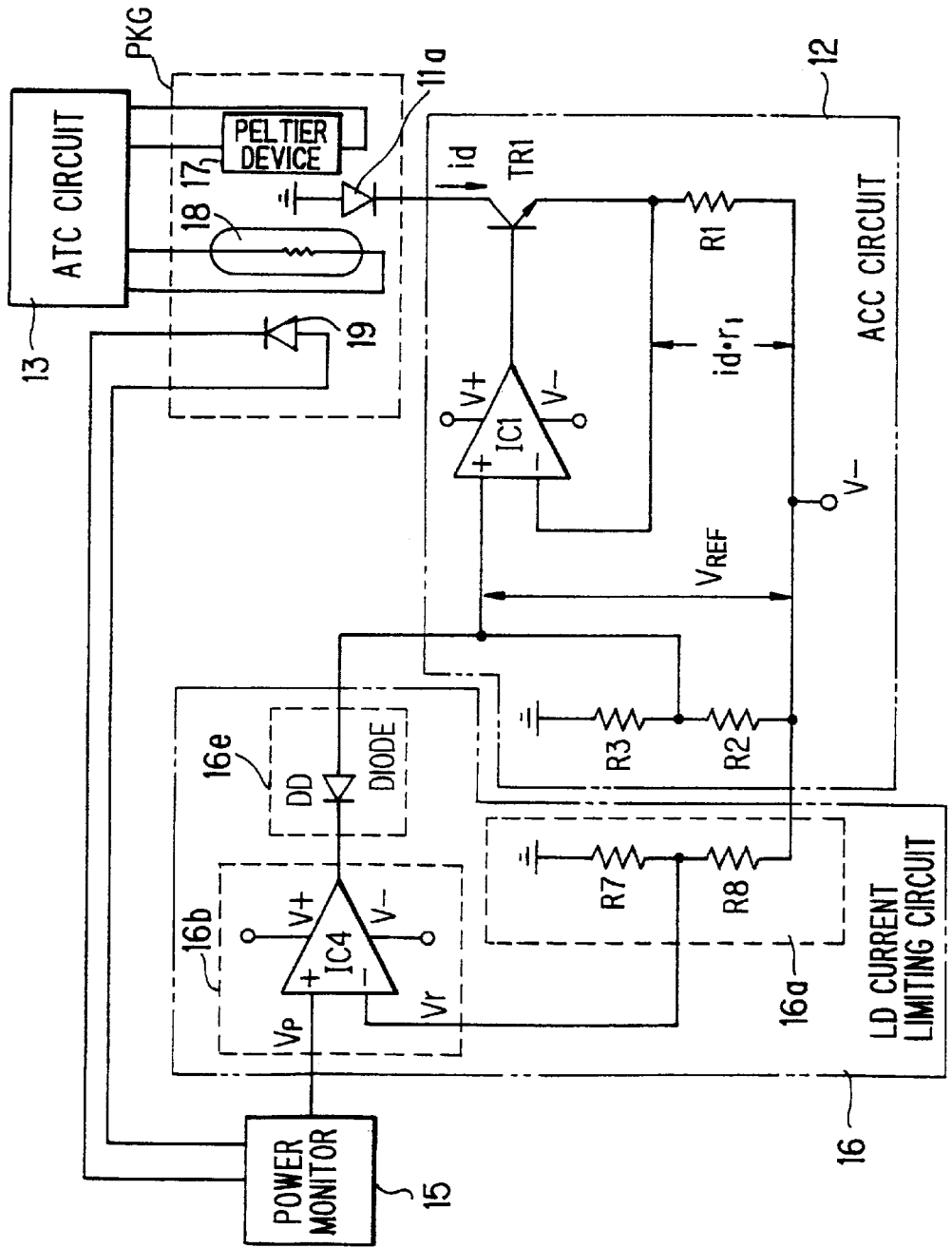
FIG. 7 is a diagram showing a second embodiment in which excessive emission is prevented by detecting emission power.

FIG. 7 is a diagram showing a second embodiment in which excessive emission is prevented by detecting emission power (backward power) of the laser diode. Components identical with those shown in FIG. 1 are designated by identical reference characters. Here the laser diode (LD) 11a of common-anode type is housed in the package PKG along with the Peltier device 17, the thermister 18 for detecting the temperature of the laser diode chip and the PIN photodiode 19 for detecting the backward power (optical intensity) of the laser diode.

Figure 25A:
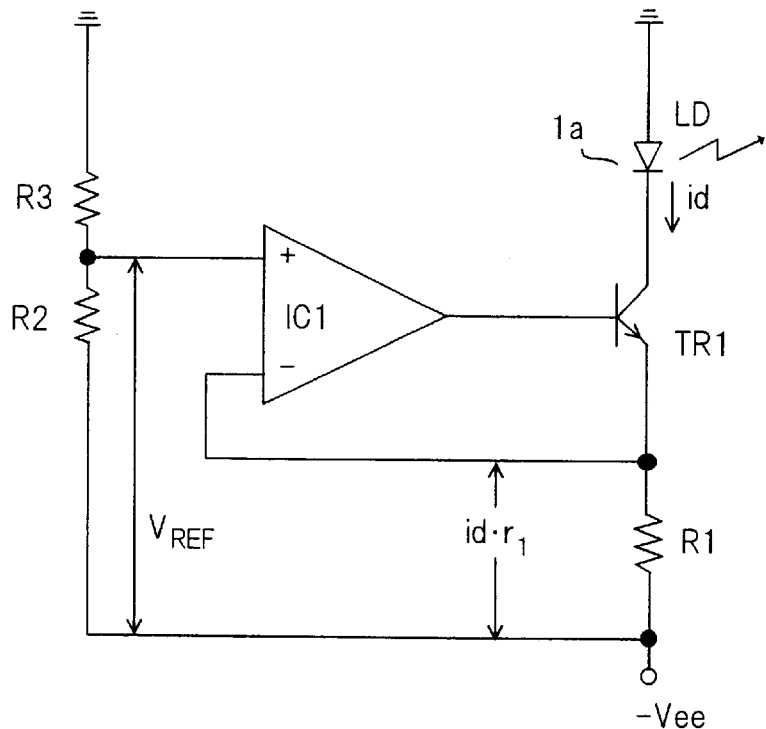
FIGS. 25A, 25B are diagrams showing examples of ACC circuits.
Figure 25B:
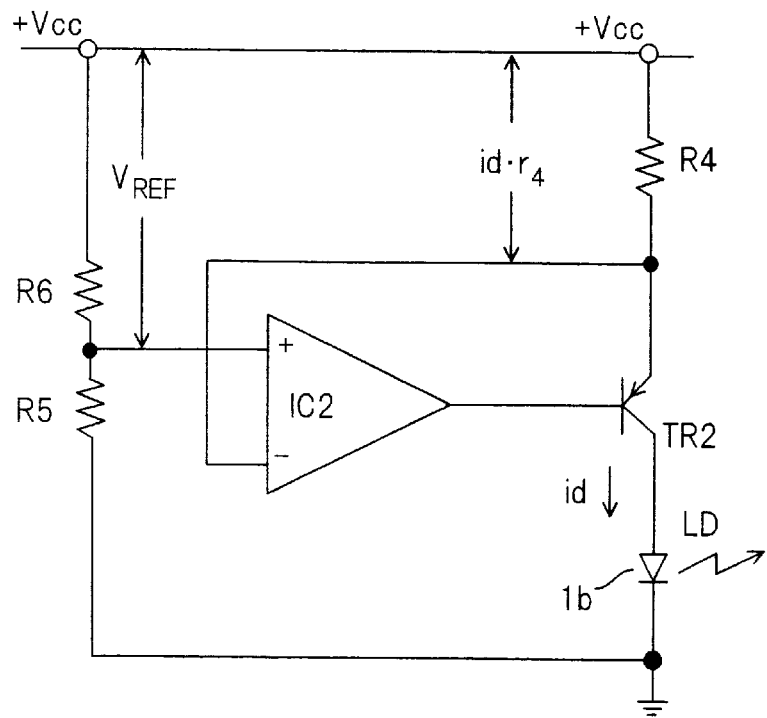

The ACC circuit 12, which is for performing control in such a manner that the laser diode current will attain the set current value, has a construction identical with that of the ACC circuit shown in FIG. 25A. In addition, the output terminal of a reference voltage reducing circuit (described later) 16e is connected to the non-inverting input terminal of the comparator IC1. If the backward power is less than the set power, the reference voltage reducing circuit 16e does not reduce the reference voltage $V_{REF}$ of the comparator IC1. Consequently, the ACC circuit 12 performs ACC in such a manner that the laser diode current id attains the set current value (=$V_{REF}$/r1). If the backward power is greater than the set power, on the other hand, the reference voltage reducing circuit 16e reduces the reference voltage $V_{REF}$ input to the non-inverting input terminal of the comparator IC1. The ACC circuit 12 performs control in such a manner that the terminal voltage (=id·r1) of the resistor R1 that prevailed at flow of the laser diode current id becomes equal to the reference voltage $V_{REF}$. When the reference voltage decreases, therefore, the laser diode current id is limited to a small value. The ATC circuit 13 performs control so as to render the laser diode temperature constant and has a construction identical with that of the ATC circuit shown in FIG. 26. The power monitor circuit 15 uses the PIN photodiode 19 to output a voltage signal (the backward power monitor signal) conforming to backward power. The laser diode current limiting circuit 16 limits the laser diode current when backward power exceeds the set power.

The laser diode current limiting circuit 16 includes the reference voltage generator 16a for outputting the reference voltage Vr through voltage division by resistors R7, R7, the comparator 16b constituted by an operational amplifier for comparing the voltage Vp dependent upon detected emission power with the reference voltage Vr, and the reference voltage reducing circuit 16e, which is constituted by a diode (DD). The reference voltage reducing circuit 16e is connected across the output terminal of the comparator 16b and the non-inverting input terminal of the comparator IC1 via the diode DD in the polarity shown.

The diode DD is forward biased when the backward power is greater than the set power (Vp<Vr). Consequently, the reference voltage VREF of the comparator IC1 in the ACC circuit 12 takes on a low potential higher than that of the output of comparator 16b by the voltage across the diode, whereby the laser diode current id is limited. If the backward power is less than the set power, on the other hand (Vp≧Vr), the diode DD is reverse biased and, hence, the reference voltage VREF of the comparator IC1 of ACC circuit 12 takes on a large value obtained by voltage division by the resistors R2, R3. The ACC circuit 12 performs control in such a manner that id·r1 becomes equal to the reference voltage $V_{REF}$, i.e., in such a manner that the laser diode current id becomes equal to $V_{REF}$/r1.

By utilizing the fact that the forward power of the laser diode and the backward power BP of the laser diode are proportionally related, the reference voltage Vr is set in advance so as to attain a backward power monitor signal voltage corresponding to that which would prevail when the forward power is some multiple of the usual value.

When power is introduced to the laser diode drive circuit at low temperatures in the arrangement described above, the voltage Vp of the backward power monitor signal BP is smaller than the reference voltage Vr (Vp<Vr) during the time that temperature of the laser diode is stabilizing. The output of the comparator 16b declines until the diode DD turns on, and the laser diode current id is decided not by the resistance dividing ratio but by a low potential higher than that of the output of comparator 16b by the voltage across the diode.

More specifically, when the backward power (emission power) rises and the voltage value Vp of the backward power monitor signal BP falls below the reference voltage Vr (i.e., when the laser diode 11a is about to emit light excessively), the diode DD turns on (is forward biased) to limit the laser diode current id. This is the APC (Automatic Power Control) mode. When the temperature of the laser diode 11a subsequently stabilizes at the set temperature owing to ATC, the voltage Vp of the backward power monitor signal BP becomes higher than the reference voltage Vr. Consequently, the output of the comparator 16b rises, the diode DD turns off (is reversed biased) and the laser diode current id takes on a current value determined by the resistance ratio of the resistors R2, R3. This is the ACC mode.

This circuit arrangement is advantageous in that it functions to prevent an excessive emission from the laser diode in a case where power is introduced at low temperature and, at the same time, can be employed as an APC circuit as well when it is used with the diode DD in the ON state at times.

Though a common-anode laser diode is used in the second embodiment of FIG. 7, it is also possible to adopt an arrangement using a common-cathode laser diode.

Figure 8:
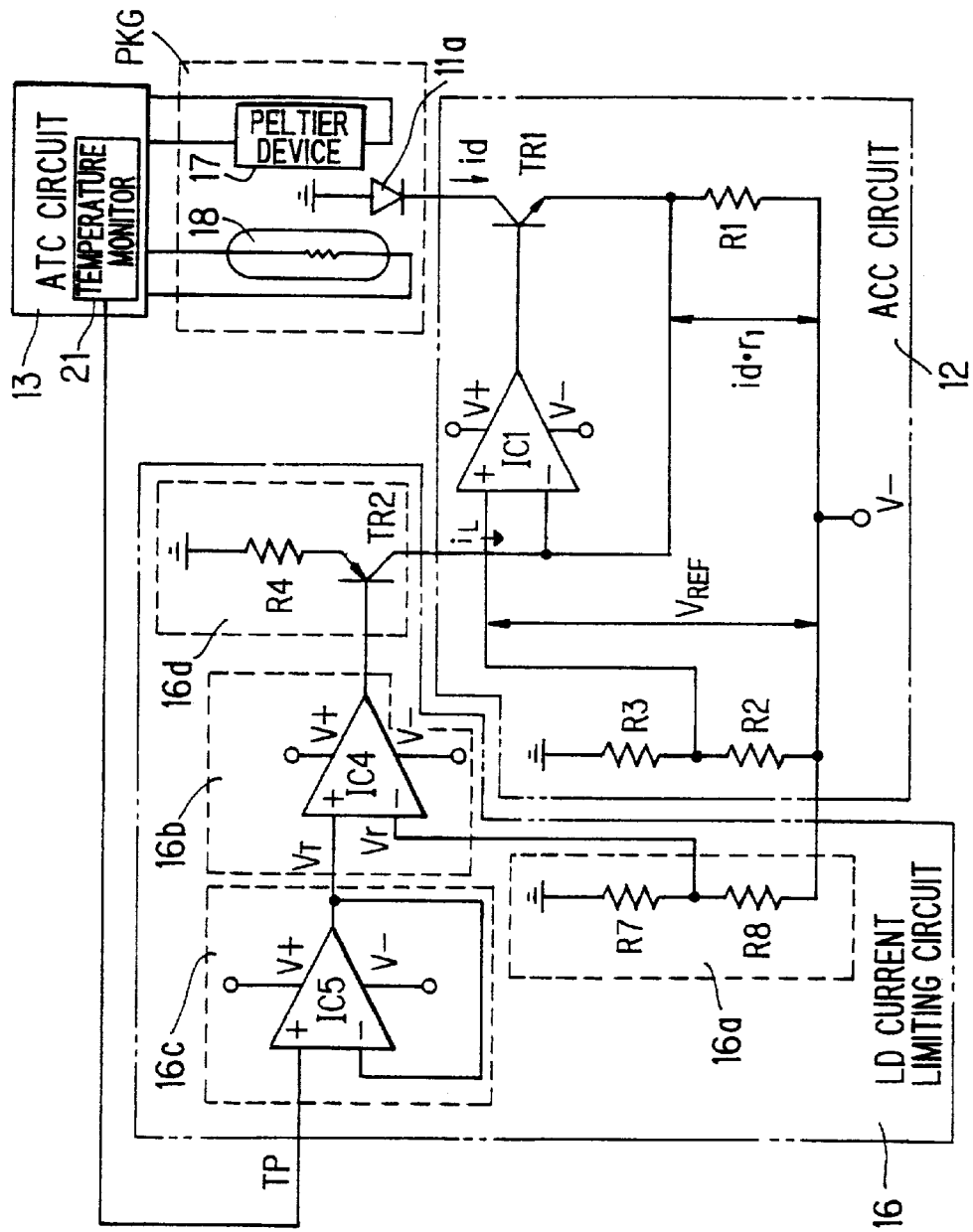
FIG. 8 is a diagram showing the first embodiment in which excessive emission is prevented by detecting laser diode temperature.

(C) Embodiments for Preventing Excessive Emission by Detecting Laser Diode Temperature (a) First embodiment FIG. 8 is a diagram showing the construction of a first embodiment in which excessive emission is prevented by detecting the temperature of the laser diode chip. This embodiment has a construction similar to that of the embodiment of FIG. 4 in which an excessive emission is prevented by detecting emission power. Components identical with those shown in FIG. 4 are designated by identical reference characters. This embodiment differs in the following respects:

(1) The power monitor circuit 15 of FIG. 4 is deleted.

(2) The input to the laser diode current limiting circuit 16 is a signal (a temperature monitor signal TP), which conforms to the laser diode temperature, output by the temperature monitor circuit 21 provided in the ATC circuit 13.

(3) The reference voltage Vr is set to a voltage that corresponds to a temperature several degrees Centigrade lower than the target temperature of ATC.

The chip temperature of the laser diode 11a is monitored by the temperature monitoring circuit 21, the temperature monitor signal TP conforming to this temperature is input to the voltage follower 16c, and a voltage $V_T$ conforming to the laser diode temperature enters the comparator 16b from the voltage follower 16c. The comparator 16b compares the reference voltage Vr, which is decided by the resistors R7, R8, with the voltage $V_T$ conforming to the laser diode temperature. The reference voltage Vr is set to a voltage value output by the temperature monitoring circuit 21 at a temperature several degrees Centigrade lower than the target temperature of ATC. Accordingly, when power is introduced to the laser diode drive circuit at low temperatures, the voltage $V_T$ output by the temperature monitoring circuit 21 takes on a potential in the negative direction with respect to the reference voltage Vr ($V_T$<Vr) during the time that the temperature of the laser diode is stabilizing (i.e., until the set temperature is attained). During the time that $V_T$<Vr holds, the output of the comparator 16b declines until the transistor TR2 of the current source 16d is capable of turning on. The current source 16d passes a current $i_L$ into the resistor R1 of the ACC circuit 12. Consequently, the inverting input of the comparator IC1 becomes greater than $V_{REF}$, which is at the non-inverting input terminal of the comparator, the transistor TR1 turns off and the laser diode current id becomes zero. Thus, during the time that the laser diode 11a is at a temperature that would result in an excessive emission, the transistor TR2 is rendered conductive to reduce the laser diode current id, as a result of which the laser diode 11a does not emit light excessively. Damage to the laser diode 11a is thus prevented and so is deterioration of the laser diode characteristics. This is the ACC termination mode.

If the temperature of the laser diode 11a subsequently rises owing to ATC and the voltage VT output by the temperature monitoring circuit 21 attains a potential higher than that of the reference voltage Vr, the output of the comparator 16b becomes positive and the transistor TR2 turns off. As a result, the ACC circuit 12 subsequently restores the ACC function so that the laser diode current id will take on a current value conforming to the reference voltage $V_{REF}$ decided by the resistors R2, R3. This is the ACC mode.

Figure 9:
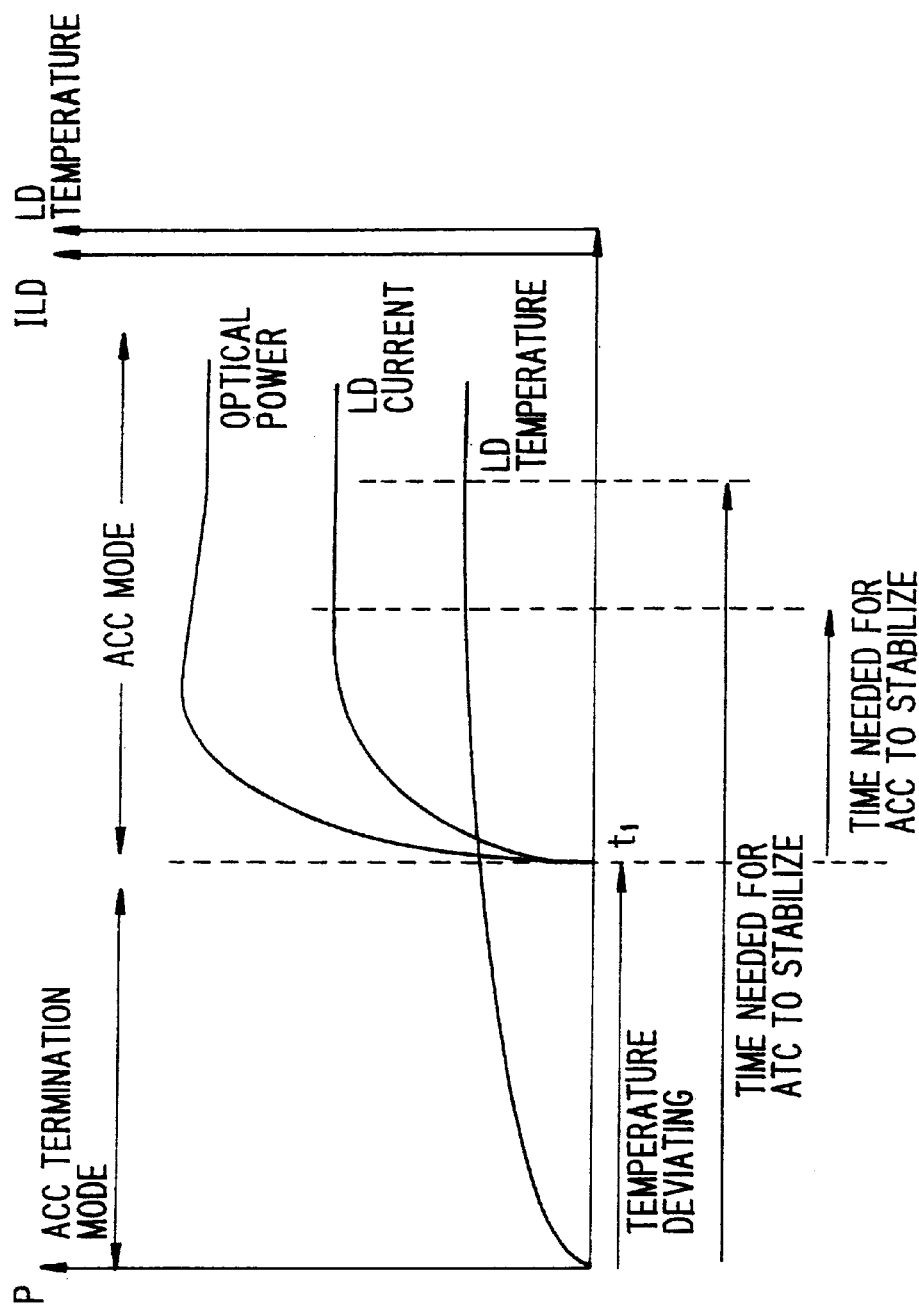
FIG. 9 is a diagram useful in describing operation according to the first embodiment of FIG. 7 when a laser diode is started up at low temperature.

The operation described above is such that when the laser diode is driven at low temperatures, the laser diode current id is zero and so is the emission power (optical output) of the laser diode until the laser diode temperature rises to a temperature several degrees Centigrade lower than the target temperature of ATC, as shown in FIG. 9. This is the ACC termination mode. In other words, during the time that the laser diode is at a temperature that would result in an excessive emission, the laser diode current id is zero and an excessive emission from the laser diode is prevented. When the temperature of the laser diode 11a subsequently rises under ATC and attains a temperature several degrees Centigrade lower than the target temperature of ATC (time $t_1$), the ACC circuit 12 restores the ACC function and performs control in such a manner that the laser diode current id takes on a current value determined by the resistance ratio of the resistors R2, R3. This is the ACC mode. Since ACC is thus performed after the temperature rises, an excessive laser diode emission does not occur. It should be noted that although the laser diode current id is made zero in the ACC termination mode in the foregoing description, this is not an essential requisite. In other words, it will suffice to pass such a laser diode current that does not cause the laser diode to emit light excessively.

By virtue of the foregoing operation, the laser diode current is forcibly reduced in a region wherein an excessive emission is most likely to occur immediately after the introduction of power at low temperature.

(b) Modification

Figure 10A:
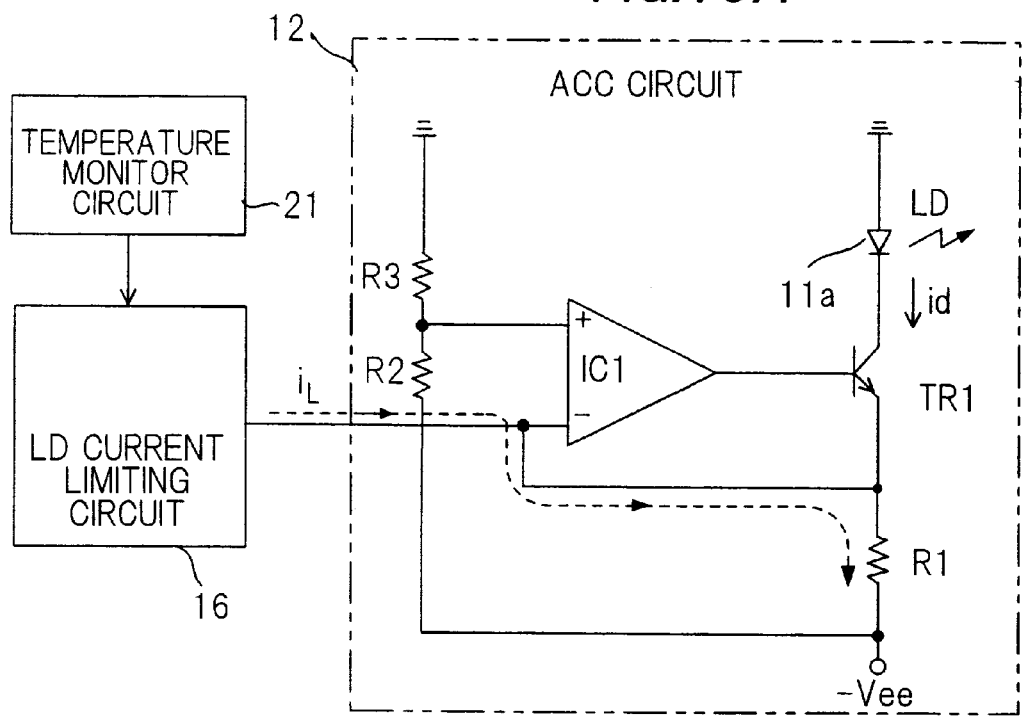
FIGS. 10A, 10B are diagrams showing arrangements of common-anode type and common-cathode type in a first embodiment for preventing excessive emission by detecting laser diode temperature.
Figure 10B:
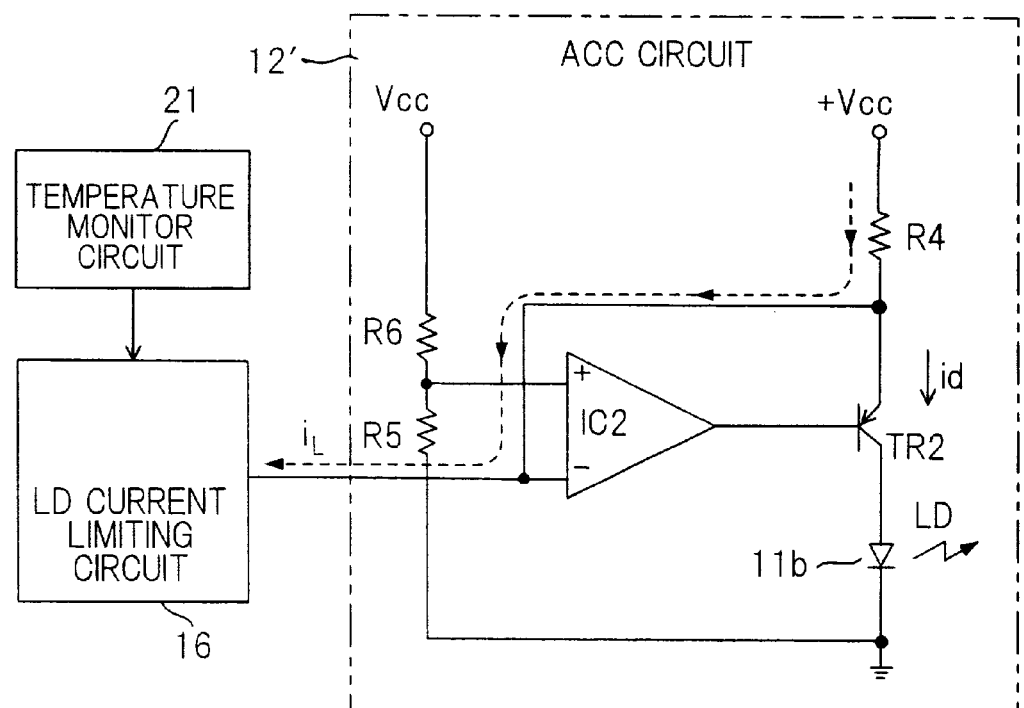

Though a common-anode laser diode is used in the first embodiment of FIG. 8, it is also possible to adopt an arrangement using a common-cathode laser diode. FIGS. 10A, 10B are diagrams showing arrangements of common-anode type and common-cathode type for preventing excessive emission by detecting laser diode temperature. FIG. 10A is a diagram showing the arrangement of common-anode type, and FIG. 10B is a diagram showing the arrangement of common-cathode type. Shown in these Figures are the ACC circuit 12 of common-anode type and the ACC circuit 12' of common-cathode type, the constructions of which are illustrated in FIGS. 25A and 25B, respectively. Numeral 16 denotes the laser diode current limiting circuit and 21 the temperature monitor.

With the ACC circuit 12 of common-anode type, the limit current $i_L$ is passed into the resistor R1, thereby enlarging the terminal voltage of the resistor R1 and limiting the laser diode current. With the ACC circuit 12' of common-cathode type, on the other hand, the laser current is limited by causing some of the current (the limit current $i_L$) that flows through the resistor R4 to flow to the outside without passing through the laser diode.

(c) Second embodiment

Figure 11:
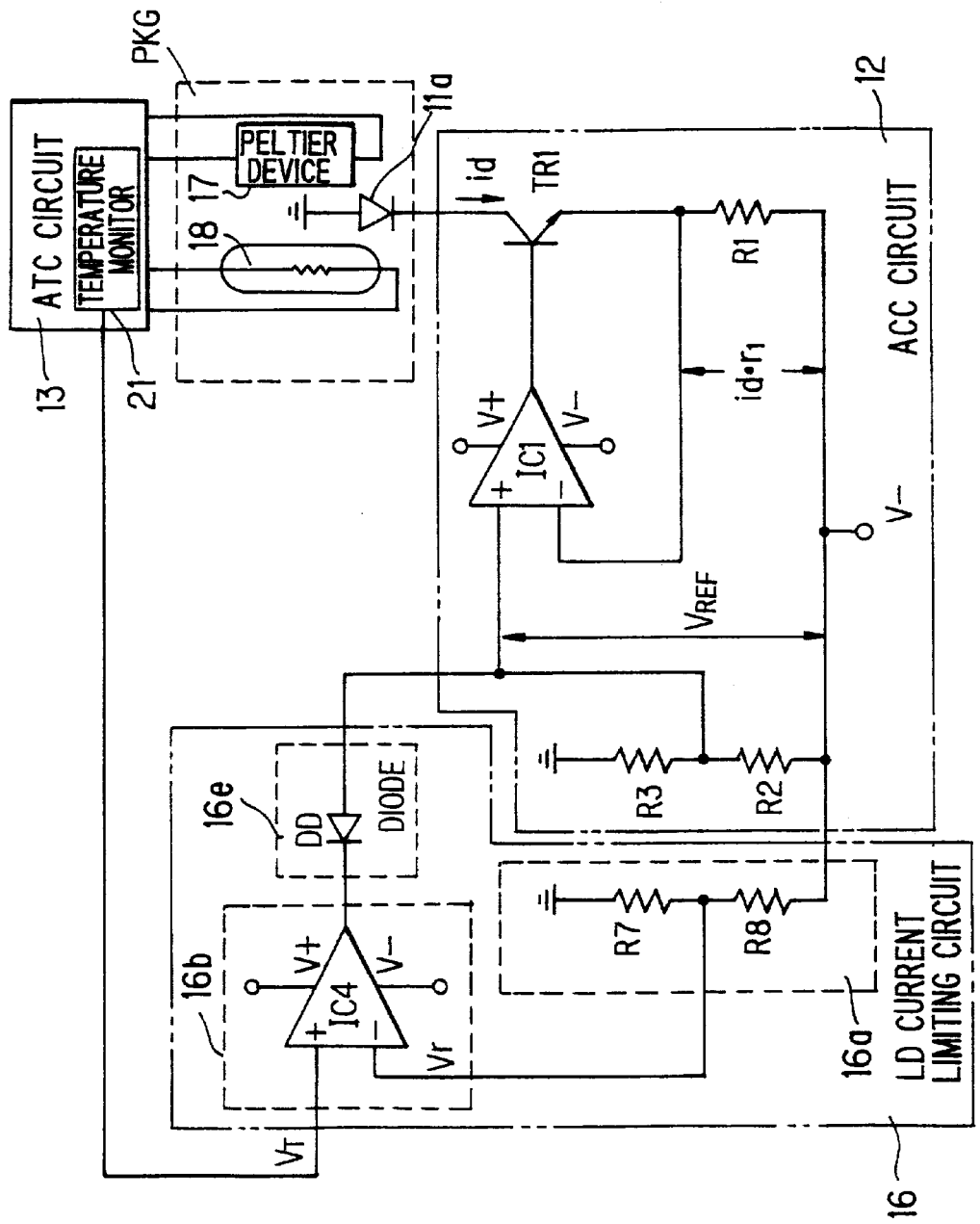
FIG. 11 is a diagram showing the second embodiment in which excessive emission is prevented by detecting laser diode temperature.

FIG. 11 is a diagram showing the construction of a second embodiment in which excessive emission is prevented by detecting the temperature of the laser diode chip. This embodiment has a construction similar to that of the embodiment of FIG. 7 in which an excessive emission is prevented by detecting emission power. Components identical with those shown in FIG. 7 are designated by identical reference characters. This embodiment differs in the following respects:

(1) The power monitor circuit 15 of FIG. 7 is deleted.

(2) The input to the laser diode current limiting circuit 16 (the non-inverting input terminal of the comparator 16b) is the voltage $V_T$, which conforms to the laser diode temperature, output by the temperature monitor circuit 21 provided in the ATC circuit 13.

(3) The reference voltage Vr is set to a voltage that corresponds to a temperature several degrees Centigrade lower than the target temperature of ATC.

The chip temperature of the laser diode 11a is monitored by the temperature monitoring circuit 21 and the voltage $V_T$ conforming to the laser diode temperature enters the comparator 16b. The comparator 16b compares the reference voltage Vr, which is decided by the resistors R7, R8, with the voltage $V_T$ conforming to the laser diode temperature. The reference voltage Vr is set to a voltage value output by the temperature monitoring circuit 21 at a temperature several degrees Centigrade lower than the target temperature of ATC. Accordingly, when power is introduced to the laser diode drive circuit at low temperatures, the voltage $V_T$ output by the temperature monitoring circuit 21 takes on a potential in the negative direction with respect to the reference voltage Vr ($V_T$<Vr) during the time that temperature of the laser diode 11a is stabilizing (i.e., until the set temperature is attained). During the time that $V_T$<Vr holds, the output of the comparator 16b declines until the diode DD of the current source 16d is capable of turning on. The laser diode current id is decided not by the resistance dividing ratio but by a low potential higher than that of the output of comparator 16b by the voltage across the diode. Thus the laser diode current is limited to such a current value that will not result in excessive emission.

Thus, during the time that the laser diode 11a is at a low temperature that would result in an excessive emission, the diode DD is rendered conductive to reduce the laser diode current id, as a result of which the laser diode 11a does not emit excessively. Damage to the laser diode 11a is thus prevented and so is deterioration of the laser diode characteristics. This is the ACC termination mode.

If the temperature of the laser diode 11a subsequently rises owing to ATC and the voltage VT output by the temperature monitoring circuit 21 attains a potential higher than that of the reference voltage Vr, the output of the comparator 16b becomes positive and the diode DD turns off. As a result, the ACC circuit 12 subsequently restores the ACC function so that the laser diode current id will take on a current value conforming to the reference voltage VREF decided by the resistors R2, R3. This is the ACC mode.

Though a common-anode laser diode is used in the second embodiment of FIG. 11, it is also possible to adopt an arrangement using a common-cathode laser diode.

Figure 12:
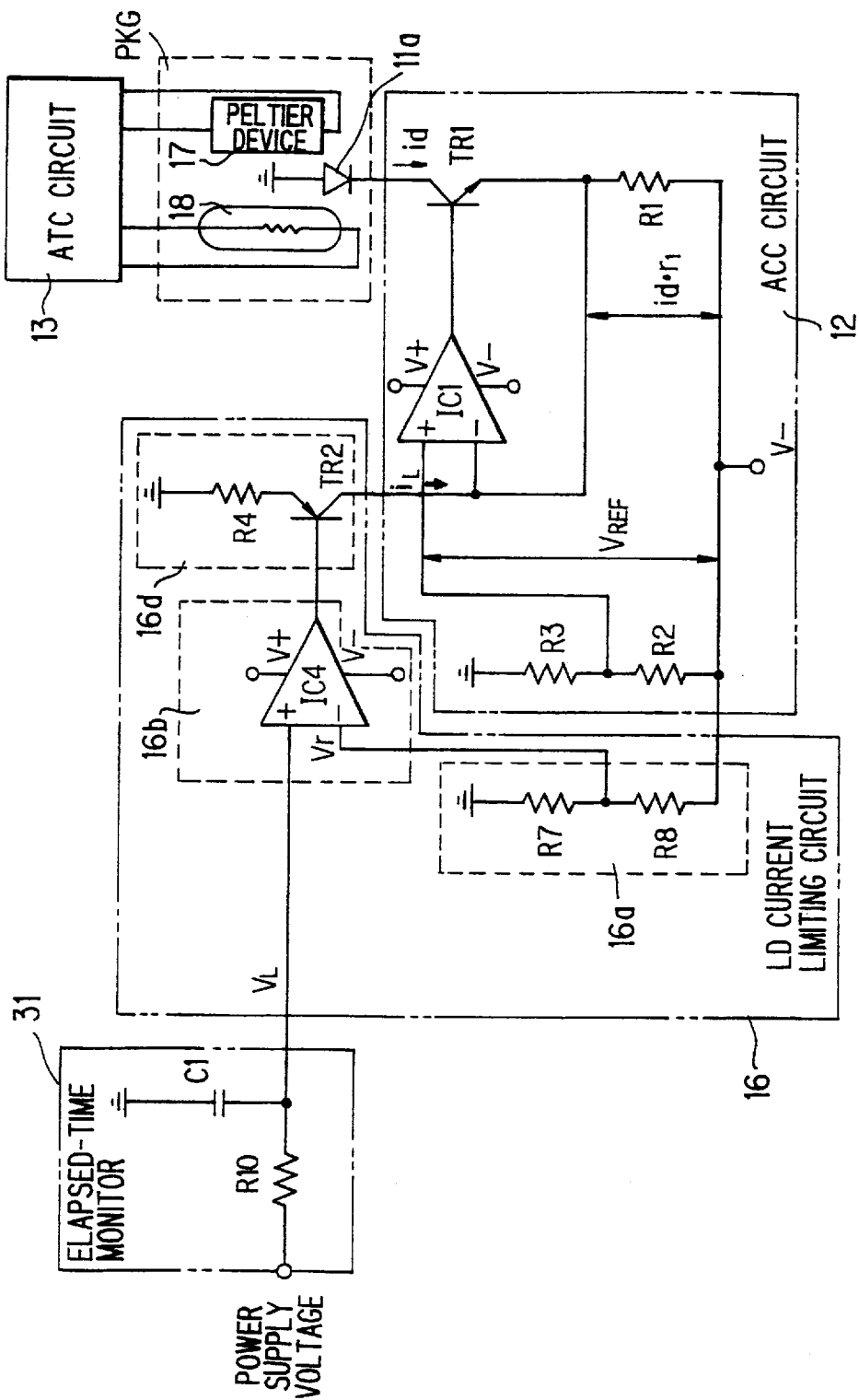
FIG. 12 is a diagram showing the first embodiment in which excessive emission is prevented by monitoring time that elapses from introduction of power.

(D) Embodiments for Preventing Excessive Emission by Monitoring Time that Elapses from Introduction of Power (a) First embodiment FIG. 12 is a diagram showing the construction of first embodiment in which excessive emission is prevented by monitoring time that elapses from introduction of power. This embodiment has a construction similar to that of the embodiment of FIG. 4 in which an excessive emission is prevented by detecting emission power. Components identical with those shown in FIG. 4 are designated by identical reference characters. This embodiment differs in the following respects:

(1) The power monitor circuit 15 and voltage follower 16c of FIG. 4 is deleted.

(2) The elapsed-time monitor circuit 31 is provided for monitoring time that elapses from introduction of power and the input to the laser diode current limiting circuit 16 (the non-inverting terminal of the comparator 16b) is a reference voltage $V_L$, which conforms to elapsed time, output by the elapsed-time monitor circuit 31.

(3) A voltage corresponding to the time needed for the laser diode temperature to attain a substantially constant temperature by ATC following the introduction of power is set as a reference voltage Vr.

The elapsed-time monitor circuit 31 is constituted by an integrator circuit composed of a resistor R10 and a capacitor C1 and has a power supply voltage applied thereto. If power is introduced to the laser diode drive at low temperature, the capacitor terminal voltage (output voltage $V_L$) rises exponentially at a time constant R10•C1 from the moment power introduction. The comparator 16b compares the reference voltage Vr, which is decided by the resistor R7, R8, with the reference voltage $V_L$ that conforms to elapsed time measured from the moment of power introduction. The reference voltage Vr is a voltage that corresponds to the time needed for the laser diode temperature to attain a substantially constant temperature by ATC following the introduction of power. Consequently, the voltage $V_L$ output by the elapsed-time monitor circuit 31 takes on a potential in the negative direction with respect to the reference voltage Vr ($V_L$<Vr) during the time that the temperature of the laser diode 11a is stabilizing.

During the time that $V_L$<Vr holds, the output of the comparator 16b declines until the transistor TR2 of the current source 16d is capable of turning on. The current source 16d passes a current into the resistor R1 of the ACC circuit 12. Consequently, the inverting input of the comparator IC1 becomes greater than $V_{REF}$, which is at the non-inverting input terminal of the comparator, the transistor TR1 turns off and the laser diode current id becomes zero. Thus, the transistor TR2 is driven into conduction to reduce the laser diode current id until the laser diode temperature becomes substantially constant, i.e., until the elapse of a period of time in which an excessive emission from the laser diode 11a is possible. Damage to the laser diode 11a is thus prevented and so is deterioration of the laser diode characteristics. This is the ACC termination mode.

If the temperature of the laser diode 11a subsequently rises and attains a substantially constant temperature owing to ATC, the voltage $V_L$ output by the elapsed-time monitor circuit 31 attains a potential higher than that of the reference voltage Vr. If the relation $V_L$>Vr is established, the output of the comparator 16b becomes positive and the transistor TR2 turns off. As a result, the ACC circuit 12 subsequently restores the ACC function so that the laser diode current id will take on a current value conforming to the reference voltage $V_{REF}$ decided by the resistors R2, R3. This is the ACC mode.

Figure 13:
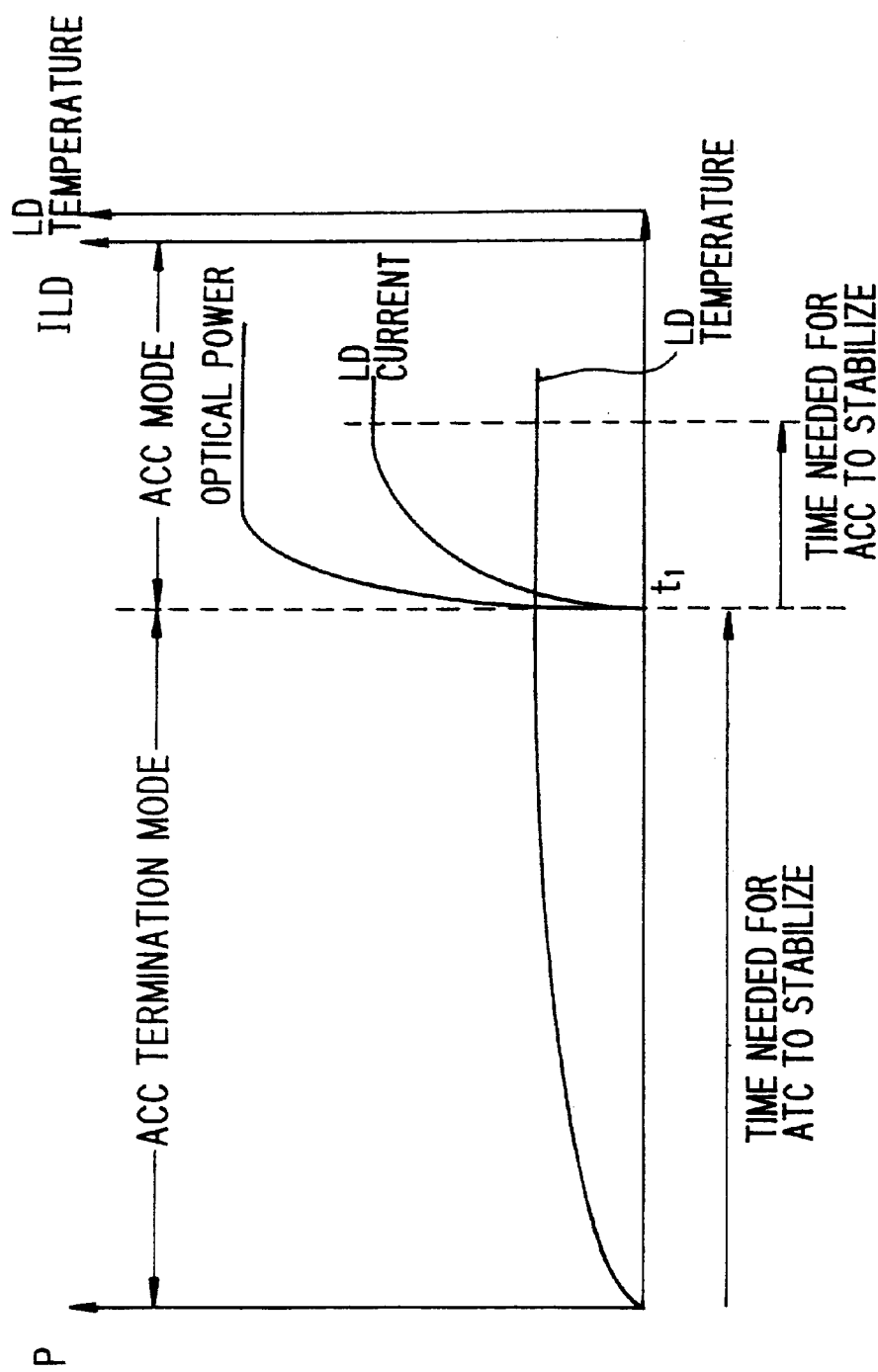
FIG. 13 is a diagram useful in describing operation at low-temperature start-up of a laser diode in a configuration in which time that elapses from introduction of power is monitored.

The operation described above is such that when the laser diode is driven at low temperatures, the laser diode current id is zero and so is the emission power of the laser diode until the laser diode temperature stabilizes, as shown in FIG. 13. This is the ACC termination mode. In other words, during the time that the laser diode is at a low temperature that would result in an excessive emission, the laser diode current id is zero and an excessive emission from the laser diode is prevented. When the temperature of the laser diode 11a subsequently stabilizes under ATC (time $t_1$), the ACC circuit 12 restores the ACC function and performs control in such a manner that the laser diode current id takes on a current value determined by the resistance ratio of the resistors R2, R3. This is the ACC mode. Since ACC is thus performed after the temperature rises, an excessive laser diode emission does not occur. It should be noted that although the laser diode current id is made zero in the ACC termination mode in the foregoing description, this is not an essential requisite. In other words, it will suffice to pass such a laser diode current that does not cause the laser diode to emit light excessively.

By virtue of the foregoing operation, the ACC circuit 12 does not operate for several seconds following the introduction of power. At low-temperature start-up, therefore, first the ATC circuit 13 functions to stabilize temperature. Once temperature has stabilized, the ACC circuit 12 begins operating. This makes it possible to prevent an excessive emission from the laser diode.

(b) Modification of first embodiment

Figure 14:
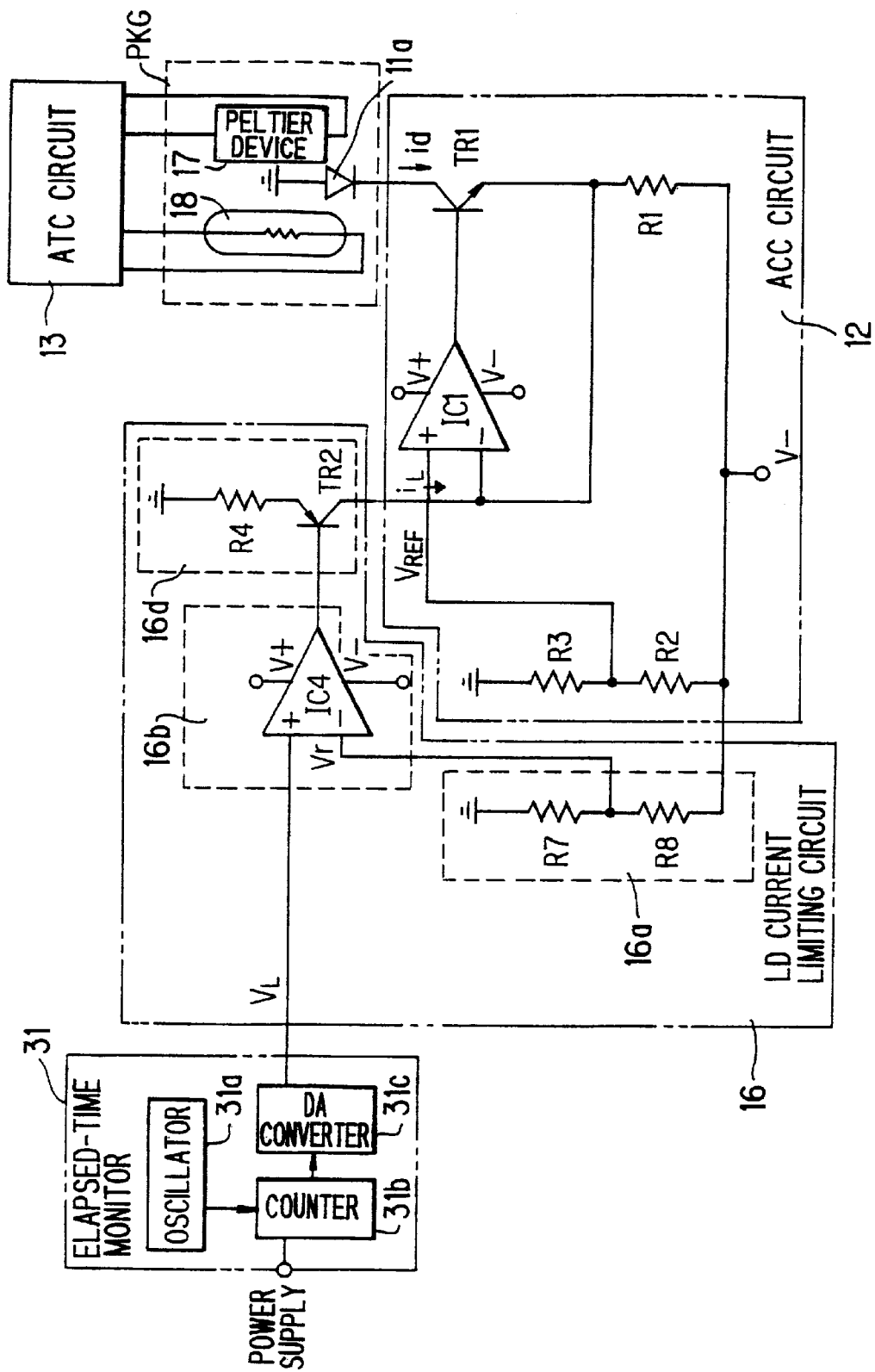
FIG. 14 is a diagram showing a modification of the first embodiment.

FIG. 14, which illustrates a modification of the first embodiment, is an example in which the circuit 31 for monitoring elapse of time from introduction of power is constituted by a counter and a DA converter. More specifically, the elapsed-time monitor circuit 31 includes an oscillator 31a which oscillates at a constant frequency, a counter 31b and a DA converter 31c for converting the digital count from the counter 31b to an analog signal. The counter 31b counts pulses output by the oscillator 31a after power is introduced, and the DA converter 31c subjects the count from the counter to digital-to-analog conversion to output a voltage signal $V_L$ that increases in proportion to elapsed time.

(c) Other modification of first embodiment

Figure 15A:
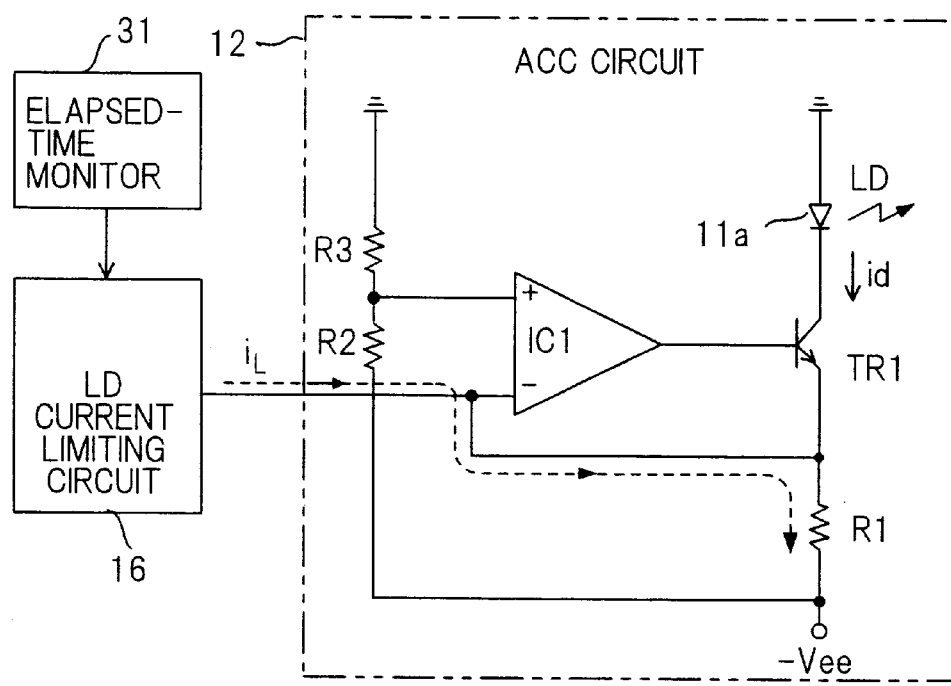
FIGS. 15A, 15B are diagrams showing arrangements of common-anode type and common-cathode type in a first embodiment for preventing excessive emission by monitoring time that elapses from introduction of power.
Figure 15B:
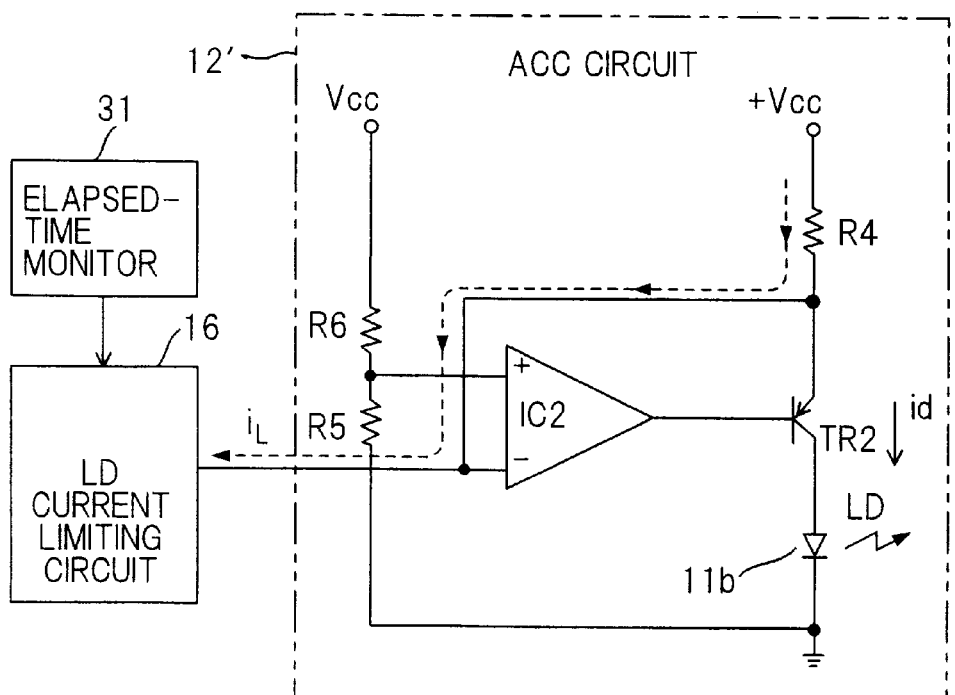

Though a common-anode laser diode is used in the first embodiment of FIG. 12, it is also possible to adopt an arrangement using a common-cathode laser diode. FIGS. 15A, 15B are diagrams showing arrangements of common-anode type and common-cathode type for preventing excessive emission by detecting elapsed time. FIG. 15A is a diagram showing the arrangement of common-anode type, and FIG. 15B is a diagram showing the arrangement of common-cathode type. Shown in these Figures are the ACC circuit 12 of common-anode type and the ACC circuit 12' of common-cathode type, the constructions of which are illustrated in FIGS. 25A and 25B, respectively. Numeral 16 denotes the laser diode current limiting circuit and 31 the temperature monitor.

With the ACC circuit 12 of common-anode type, the limit current $i_L$ is passed into the resistor R1, thereby enlarging the terminal voltage of the resistor R1 and limiting the laser diode current. With the ACC circuit 12' of common-cathode type, on the other hand, the laser current is limited by causing some of the current (the limit current $i_L$) that flows through the resistor R4 to flow to the outside without passing through the laser diode.

(d) Second embodiment

Figure 16:
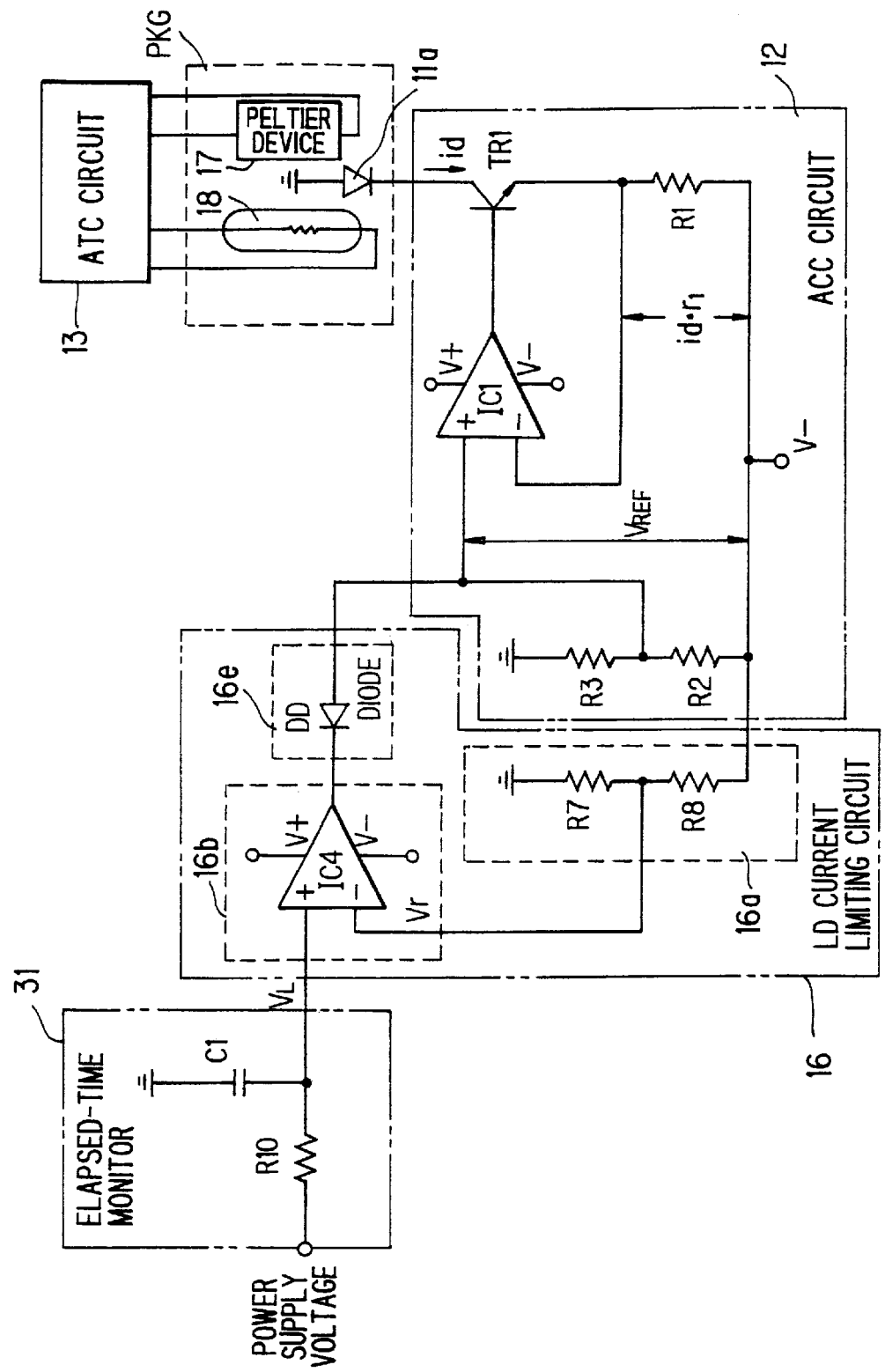
FIG. 16 is a diagram showing the second embodiment in which excessive emission is prevented by monitoring time that elapses from introduction of power is monitored.

FIG. 16 is a diagram showing the construction of a second embodiment in which excessive emission is prevented by monitoring elapse of time from introduction of power. This embodiment has a construction similar to that of the embodiment of FIG. 7 in which an excessive emission is prevented by detecting emission power. Components identical with those shown in FIG. 7 are designated by identical reference characters. This embodiment differs in the following respects:

(1) The power monitor circuit 15 of FIG. 7 is deleted.

(2) The elapsed-time monitor circuit 31 is provided for monitoring time that elapses from introduction of power and the input to the laser diode current limiting circuit 16 (the non-inverting terminal of the comparator 16b) is a reference voltage $V_L$, which conforms to elapsed time, output by the elapsed-time monitor circuit 31.

(3) A voltage corresponding to the time needed for the laser diode temperature to attain a substantially constant temperature by ATC following the introduction of power is set as a reference voltage Vr.

The elapsed-time monitor circuit 31 is constituted by an integrator circuit composed of a resistor R10 and a capacitor C1 and has a power supply voltage applied thereto. If power is introduced to the laser diode drive at low temperature, the capacitor terminal voltage (output voltage $V_L$) rises exponentially at a time constant R10•C1 from the moment of power introduction. The comparator 16b compares the reference voltage Vr, which is decided by the resistor R7, R8, with the reference voltage $V_L$ that conforms to elapsed time measured from the moment of power introduction. The reference voltage Vr is a voltage that corresponds to the time needed for the laser diode temperature to attain a substantially constant temperature by ATC following the introduction of power. Consequently, the voltage $V_L$ output by the elapsed-time monitor circuit 31 takes on a potential in the negative direction with respect to the reference voltage Vr ($V_L$<Vr) during the time that the temperature of the laser diode 11a is stabilizing.

During the time that $V_L$<Vr holds, the output of the comparator 16b declines until the diode DD is capable of turning on. The laser diode current id is decided by a low potential higher than that of the output of comparator 16b by the voltage across the diode, whereby the laser diode current id is limited. Thus, the diode DD is driven into conduction to reduce the laser diode current id during the period of low temperature over which it is likely that the laser diode 11a will emit light excessively. This is the ACC termination mode.

If the temperature of the laser diode 11a subsequently rises and attains a substantially constant temperature owing to ATC, the voltage $V_L$ output by the elapsed-time monitor circuit 31 attains a potential higher than that of the reference voltage Vr. If the relation $V_L$>Vr is established, the output of the comparator 16b becomes positive and the diode DD turns off. As a result, the ACC circuit 12 subsequently restores the ACC function so that the laser diode current id will take on a current value conforming to the reference voltage $V_{REF}$ decided by the resistors R2, R3. This is the ACC mode.

By virtue of the foregoing operation, the ACC circuit 12 does not operate for several seconds following the introduction of power. At low-temperature start-up, therefore, first the ATC circuit 13 functions to stabilize temperature. Once temperature has stabilized, the ACC circuit 12 begins operating. This makes it possible to prevent an excessive emission from the laser diode.

(e) Modification of second embodiment

Figure 17:
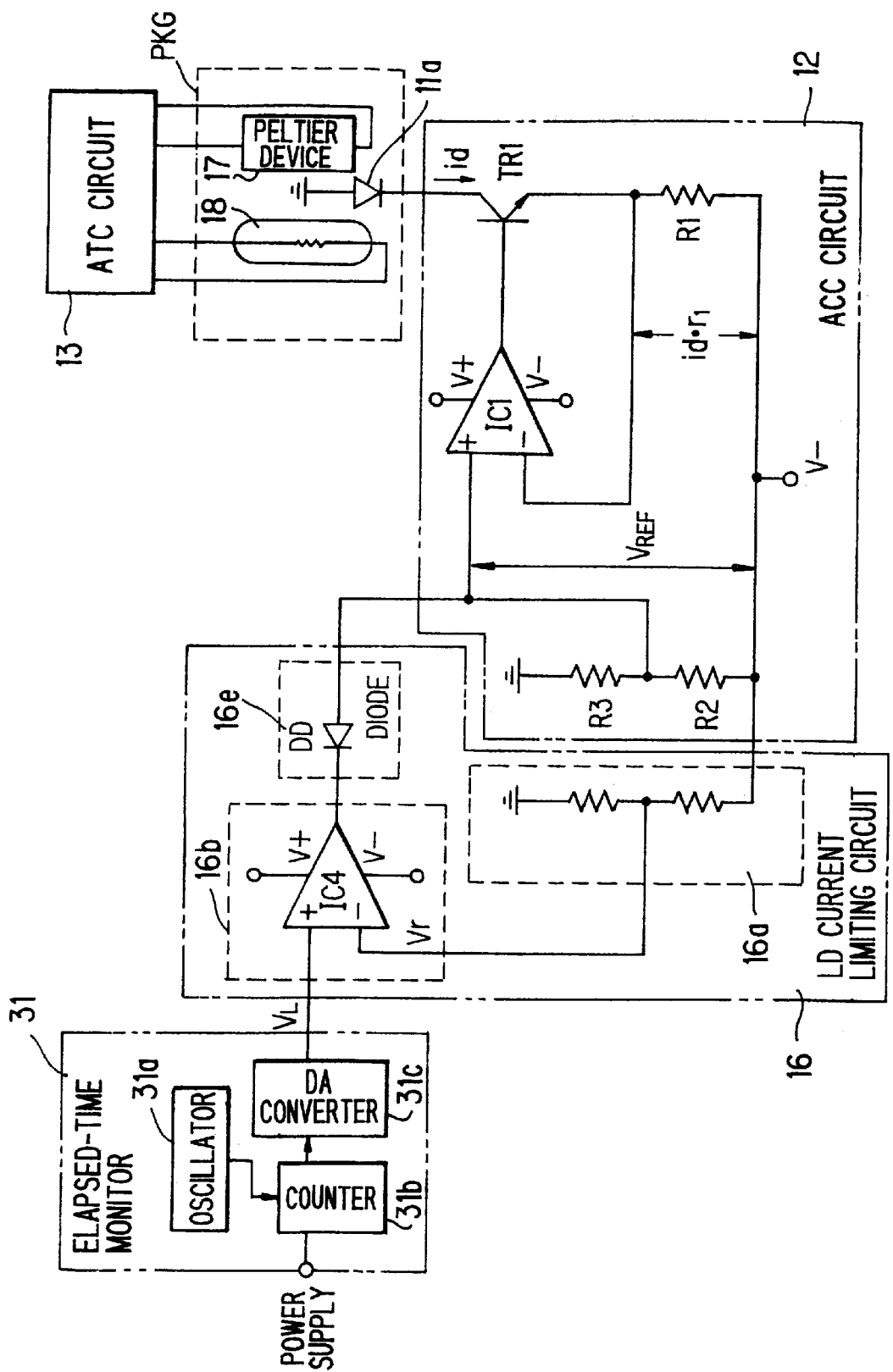
FIG. 17 is a diagram showing a modification of the second embodiment.

FIG. 17, which illustrates a modification of the second embodiment, is an example in which the circuit 31 for monitoring elapse of time from introduction of power is constituted by a counter and a DA converter. More specifically, the elapsed-time monitor circuit 31 includes the oscillator 31a which oscillates at a constant frequency, the counter 31b and the DA converter 31c for converting the digital count from the counter 31b to an analog signal. The counter 31b counts pulses output by the oscillator 31a after power is introduced, and the DA converter 31c subjects the count from the counter to digital-to-analog conversion to output a voltage signal $V_L$ that increases in proportion to elapsed time.

Though a common-anode laser diode is used in the second embodiment of FIG. 16, it is also possible to adopt an arrangement using a common-cathode laser diode.

(E) Shared Comparator (Laser Current Control Circuit)

(a) Construction

FIG. 18A is a diagram showing the construction of a comparator (laser current control circuit) ICC sharable in ACC circuits of laser diodes of both the common-anode and common-cathode types. The shared comparator ICC can be made common use of as the comparators IC1, IC2 of FIGS. 25A and 25B. FIG. 18B shows a series circuit of the ACC circuit (FIG. 25A) of common-anode type in which the common-anode laser diode 11a, transistor TR1 and resistor R1 are serially connected and inserted between ground and the negative power source. FIG. 18C shows a series circuit of the ACC circuit (FIG. 25B) of common-anode type in which the common-cathode laser diode 11b, transistor TR2 and resistor R4 are serially connected and inserted between ground and the positive power source.

The shared comparator ICC has a first input terminal $T_R$ to which the reference $V_{REF}$ is input, and a second input terminal $T_F$ to which the terminal voltage $V_F$ of resistor R1 or R4, produced by the laser diode current id, is input as a feedback signal. The shared comparator ICC has an output terminal Tout connected to the base terminal of the transistor TR1 of the common-anode series circuit or to the base terminal of the transistor TR2 of the common-cathode series circuit.

The shared comparator ICC has an operational amplifier Opamp and resistors Ra, Rb, which are for attenuation. The other resistors and transistors construct emitter followers. More specifically, complementary emitter follower circuits are constructed by two transistors $TR_{iK}$, $TR_{iA}$ and two resistors $R_{iK}$, $R_{iA}$ (i=1, 2, 3) having identical suffix numbers. The reference voltage $V_{REF}$ is input to a first complementary emitter follower circuit of suffix 1, the feedback voltage $V_F$ is input to a second complementary emitter follower circuit of suffix 2, and the output signal of the operational amplifier OPamp is input to a third complementary emitter follower circuit of suffix 3. Elements having the suffix A operate when the common-anode laser diode is driven, and elements having the suffix K operate when the common-cathode laser diode is driven.

(b) Complementary emitter follower circuit

FIG. 19A is a diagram useful in describing the operation of the complementary emitter follower circuit. The two transistors $TR_{iK}$, $TR_{iA}$ of different polarities have their emitters connected together as well as their bases, the collector of the npn transistor $TR_{iK}$ is connected to the positive power source +Vcc, the collector of the pnp transistor $TR_{iA}$ is connected to the negative power source −Vee, and a positive or negative input signal is applied to the bases of these transistors. When a signal having positive polarity is input to the bases, the npn transistor $TR_{iK}$ turns on and the pnp transistor $TR_{iA}$ turns off, thereby constructing an emitter follower circuit of gain 1, in which the resistor $R_{iK}$ serves as the emitter resistor, as shown in FIG. 19B. An output signal of positive polarity having the same amplitude as that of the input signal appears at the output terminal OUT. When a signal having negative polarity is input to the bases, the npn transistor $TR_{iK}$ turns off and the pnp transistor $TR_{iA}$ turns on, thereby constructing an emitter follower circuit of gain 1, in which the resistor $R_{iA}$ serves as the emitter resistor, as shown in FIG. 19C. An output signal of negative polarity having the same amplitude as that of the input signal appears at the output terminal OUT.

(c) Operation of shared comparator

In a case where the driving current of the common-anode laser diode is controlled, the polarities of the reference voltage $V_{REF}$ and feedback voltage $V_F$ input to the input terminals $T_R$, $T_F$ (the base terminals of the first and second complementary emitter follower circuits) of the shared comparator ICC are positive. When the driving current of the common-anode laser diode is controlled, therefore, the first and second complementary emitter follower circuits operate as shown in FIG. 19C, and the reference voltage $V_{REF}$ and feedback voltage $V_F$ of negative polarity are input to the non-inverting input terminal and inverting input terminal of the operational amplifier OPamp via the attenuation resistors Ra, Rb, respectively.

In a case where the driving current of the common-cathode laser diode is controlled, the polarities of the reference voltage $V_{REF}$ and feedback voltage $V_F$ input to the input terminals $T_R$, $T_F$ (the base terminals of the first and second complementary emitter follower circuits) of the shared comparator ICC are positive. When the driving current of the common-cathode laser diode is controlled, therefore, the first and second complementary emitter follower circuits operate as shown in FIG. 19B, and the reference voltage $V_{REF}$ and feedback voltage $V_F$ of positive polarity are input to the non-inverting input terminal and inverting input terminal of the operational amplifier OPamp via the attenuation resistors Ra, Rb, respectively.

The attenuation resistors Ra, Rb convert the input signal level to a level that falls within the operating range of the operational amplifier OPamp. That is, even if the amplitude of the input signal (the reference voltage $V_{REF}$ and feedback voltage $V_F$) is +Vcc to −Vee, the level is converted to a level within the input range (+Vcc−1.5) to (−Vee+1.5) at which the operational amplifier OPamp can operate.

The operational amplifier OPamp outputs +Vcc if the non-inverting input signal is greater than the inverting input signal and −Vee if the converse is true. Accordingly, in the case where the driving current id of the common-anode laser diode 11a is controlled, $V_F<V_{REF}$ holds and the output signal of the operational amplifier OPamp becomes +Vcc if the driving current id is less than the set value. As a result, the transistor $TR_{3a}$ of the third emitter follower circuit turns on, a high-level signal is output by the output terminal Tout, the transistor TR1 of the common-anode series circuit turns on and the driving current id of the common-anode laser diode 11a increases. If the driving current id is greater than the set value, on the other hand, $V_F>V_{REF}$ holds and the output signal of the operational amplifier OPamp becomes −Vee. As a result, the transistor $TR_{3b}$ of the third emitter follower circuit turns on, a low-level signal is output by the output terminal Tout, the transistor TR1 of the common-anode series circuit turns off and the driving current id of the common-anode laser diode 11a decreases.

In the case where the driving current id of the common-anode laser diode 1b is controlled, $V_F>V_{REF}$ holds and the output signal of the operational amplifier OPamp becomes −Vee if the driving current id is less than the set value. As a result, the transistor $TR_{3b}$ of the third emitter follower circuit turns on, a low-level signal is output by the output terminal Tout, the transistor TR2 of the common-cathode series circuit turns on and the driving current id of the common-cathode laser diode 11b increases. If the driving current id is greater than the set value, on the other hand, $V_F<V_{REF}$ holds and the output signal of the operational amplifier OPamp becomes +Vcc. As a result, the transistor $TR_{3a}$ of the third emitter follower circuit turns on, a high-level signal is output by the output terminal Tout, the transistor TR2 of the common-cathode series circuit turns off and the driving current id of the common-cathode laser diode 11b decreases.

The shared comparator ICC of the present invention is constructed in such a manner that emitter follower circuits obtained by connecting transistors of different polarities in complementary fashion are added on to the input and output stages of a typical operational amplifier OPamp, with one transistor being forward biased and turning on and the other transistor being reverse biased and turning off depending upon whether the input voltage is in the vicinity of the positive power source voltage or negative power source voltage. Furthermore, a level shift is performed in such a manner that the emitter follower output will fall within the input voltage range of the typical operational amplifier OPamp. By using such a shared comparator ICC in an ACC circuit, the driving currents of a common-anode laser diode and common-cathode laser diode can be controlled merely by changing the reference voltage generating portion and series circuit.

Though the foregoing description relates to a case where the power source voltages are +Vcc and −Vee, one of these can be made ground. That is, by making the combination of parallel voltages +Vcc, 0 (=−Vee) or 0 (=+Vcc), −Vee, it is possible to detect on which side (+Vcc, −Vee) an input is nearest.

(F) Shared Laser Diode Current Limiting Circuit

The embodiment (FIGS. 4 to 7) for preventing excessive emission by detecting emission power, the embodiment (FIGS. 4 to 11) for preventing excessive emission by detecting laser diode temperature, and the embodiment (FIGS. 12 to 17) for preventing excessive emission by monitoring elapsed time following introduction of power are embodiments in which the laser diode driving current of the common-anode laser diode or common-cathode laser diode is limited in such a manner that an excessive emission will not occur. Accordingly, it would be convenient if the laser diode current limiting circuit could be made sharable by both the common-anode laser diode and common-cathode laser diode, and such sharing would make it possible to lower cost.

Figure 20:
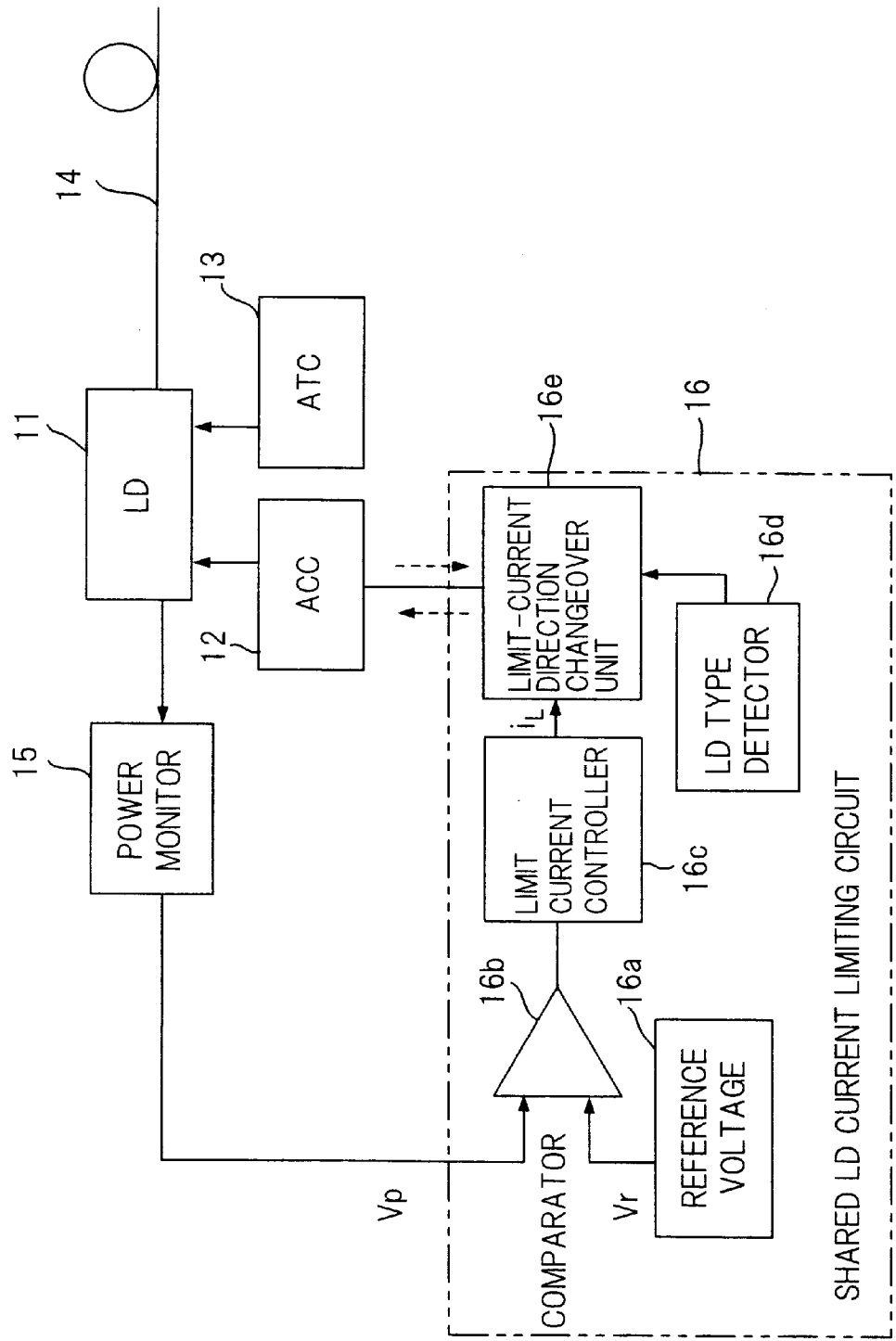
FIG. 20 is a block diagram showing the construction of a shared laser diode current limiting circuit for detecting emission power and preventing excessive emission.

(a) Shared laser diode current limiting circuit for preventing excessive emission by detecting emission power FIG. 20 is a diagram showing the construction of a shared laser diode current limiting circuit so adapted that a laser diode current limiting circuit for preventing excessive emission by detecting emission power is made sharable by both a common-anode laser diode and common-cathode laser diode. Shown in FIG. 20 are the laser diode 11, which is of common-anode or common-cathode type, the ACC circuit 12 for performing control in such a manner that the laser diode current attains a set value, the ATC circuit 13 for performing control in such a manner that the laser diode temperature is rendered constant, the optical fiber 14, and the power monitor circuit 15 for monitoring emission power of the laser diode 11. The power monitor circuit 15 detects the backward power (BP) of the laser diode as the emission power thereof. Numeral 16 denotes the shared laser diode current limiting circuit for controlling laser diode current when the emission power exceeds a set power.

The shared laser diode current limiting circuit 16 includes the reference voltage generator 16a for outputting the reference voltage Vr conforming to set power, the comparator 16b for comparing the voltage Vp, which conforms to detected emission power, with the reference voltage Vr, the limit-current controller 16c for outputting a constant limit current $i_L$ when emission power surpasses the set value and for making the limit current zero when the emission power falls below the set value, a laser-diode type detector 16d for detecting whether the laser diode 11 is of the common-anode type or common-cathode type, and a limit-current direction changeover unit 16e, to which the limit current $i_L$ is applied, for performing control in such a manner that (1) when the laser diode 11 is of the common-anode type, the limit current flows into the ACC circuit 12, and (2) when the laser diode 11 is of the common-cathode type, a current equivalent to the limit current flows out of the ACC circuit 12.

As described above in connection with FIG. 6, the common-anode ACC circuit 12 is such that the limit current $i_L$ is caused to flow into the resistor R1, thereby enlarging the terminal voltage of the resistor R1 and limiting the laser diode current. On the other hand, the common-cathode ACC circuit 12' is such that some (the limit current $i_L$) of the current that flows through the resistor R4 is caused to flow to the outside without passing through the laser diode, thereby limiting the laser diode current.

Accordingly, the shared laser diode current limiting circuit 16 performs control in such a manner that the limit current $i_L$ is caused to flow into the ACC circuit if the ACC circuit is of the common-anode type, and in such a manner that the ACC circuit splits the limit current if the ACC circuit is of the common-cathode type.

The details of the laser diode current limiting circuit 16 and limit-current direction changeover unit 16e.

Figure 21:
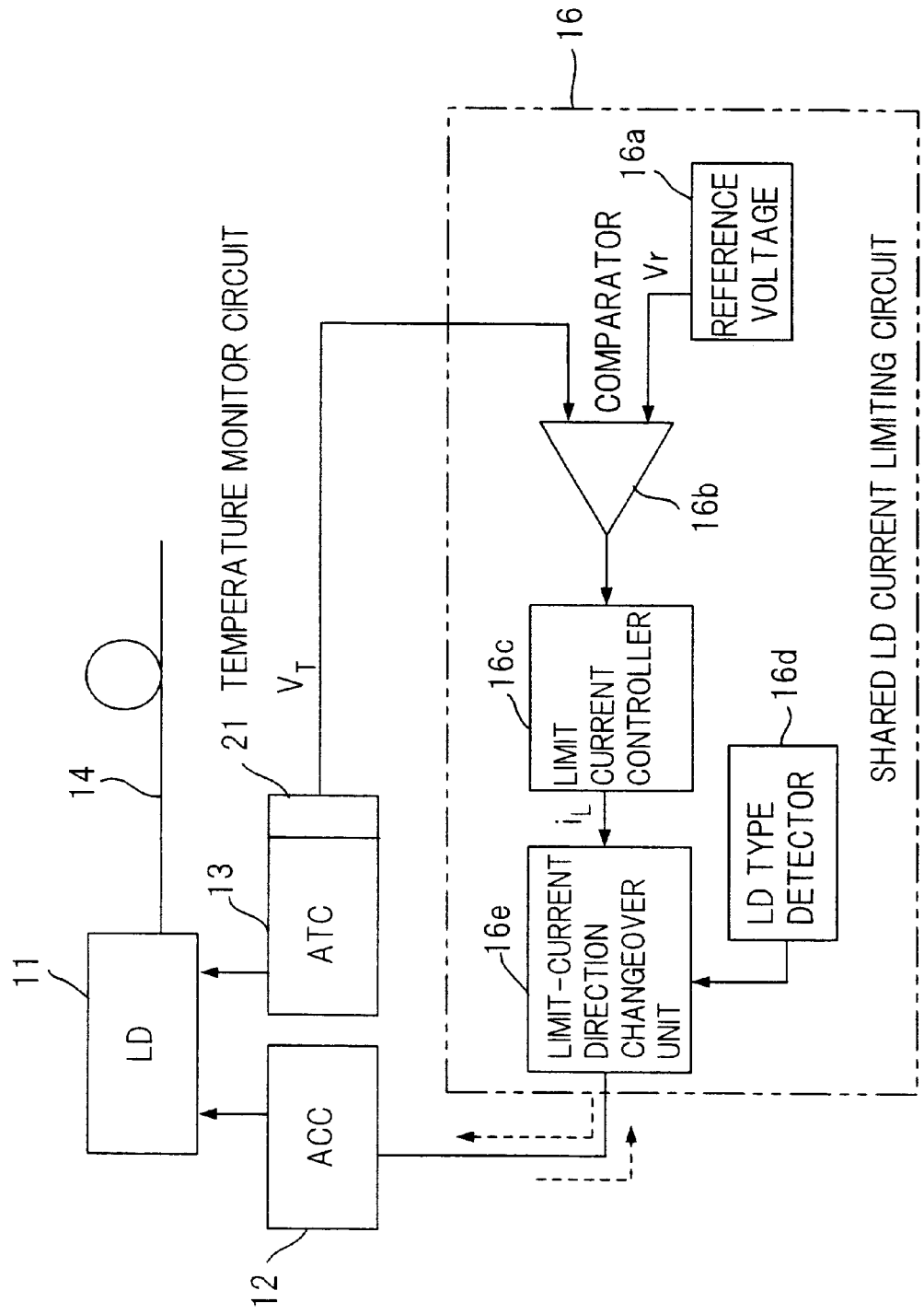
FIG. 21 is a block diagram showing the construction of a shared laser diode current limiting circuit for detecting laser diode temperature and preventing excessive emission.

(b) Shared laser diode current limiting circuit for preventing excessive emission by detecting laser diode temperature FIG. 21 is a diagram showing the construction of a shared laser diode current limiting circuit so adapted that a laser diode current limiting circuit for preventing excessive emission by detecting laser diode temperature is made sharable by both a common-anode laser diode and common-cathode laser diode. Shown in FIG. 21 are the laser diode 11, which is of common-anode or common-cathode type, the ACC circuit 12 for performing control in such a manner that the laser diode current attains a set value, the ATC circuit 13 for performing control in such a manner that the laser diode temperature is rendered constant, and the optical fiber 14. Numeral 16 denotes the laser diode current limiting circuit, which is for limiting laser diode current when the laser diode temperature is less than a set temperature. Numeral 21 denotes the temperature monitoring circuit, which is for monitoring the temperature of the laser diode chip.

The laser diode current limiting circuit 16 includes the reference voltage generator 16a for outputting the reference voltage Vr conforming to a set temperature, the comparator 16b for comparing the voltage $V_T$, which conforms to detected temperature, with the reference voltage Vr, the limit-current controller 16c for outputting a constant limit current $i_L$ when laser diode temperature is less than the set value and for making the limit current zero when the laser diode temperature is greater than the set value, the laser-diode type detector 16d for detecting whether the laser diode 11 is of the common-anode type or common-cathode type, and the limit-current direction changeover unit 16e, to which the limit current $i_L$ is applied, for performing control in such a manner that (1) when the laser diode 11 is of the common-anode type, the limit current flows into the ACC circuit 12, and (2) when the laser diode 11 is of the common-cathode type, a current equivalent to the limit current flows out of the ACC circuit 12.

As described above in connection with FIG. 10, the common-anode ACC circuit 12 is such that the limit current $i_L$ is caused to flow into the resistor R1, thereby enlarging the terminal voltage of the resistor R1 and limiting the laser diode current. On the other hand, the common-cathode ACC circuit 12' is such that some (the limit current $i_L$) of the current that flows through the resistor R4 is caused to flow to the outside without passing through the laser diode, thereby limiting the laser diode current.

Accordingly, the shared laser diode current limiting circuit 16 performs control in such a manner that the limit current $i_L$ is caused to flow into the ACC circuit if the ACC circuit is of the common-anode type, and in such a manner that the ACC circuit splits the limit current if the ACC circuit is of the common-cathode type.

Figure 22:
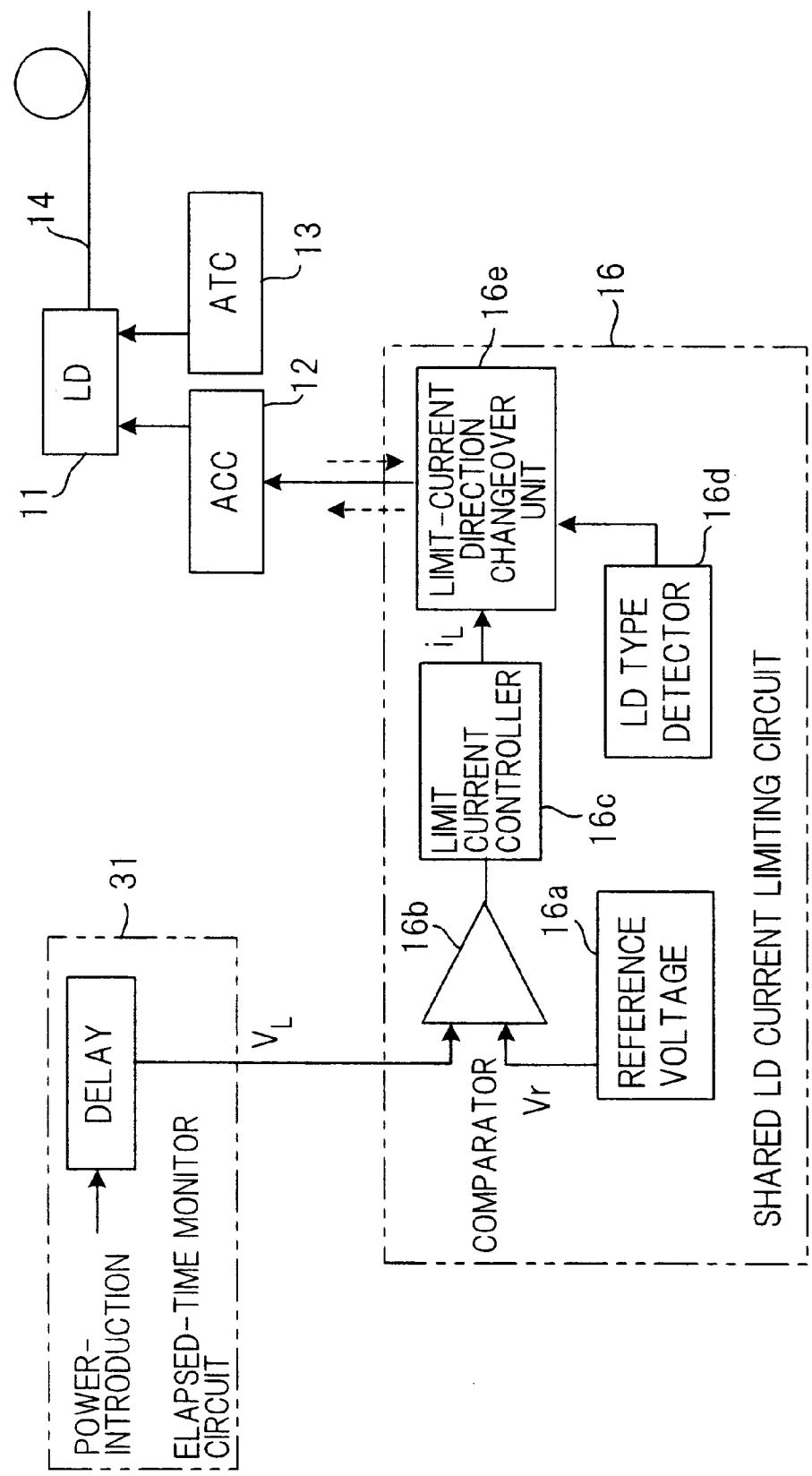
FIG. 22 is a block diagram showing the construction of a shared laser diode current limiting circuit for monitoring time that elapses from introduction of power and preventing excessive emission.

(c) Shared laser diode current limiting circuit for preventing excessive emission by monitoring elapsed time following introduction of power FIG. 22 is a diagram showing the construction of a shared laser diode current limiting circuit so adapted that a laser diode current limiting circuit for preventing excessive emission by monitoring elapsed time following introduction of power is made sharable by both a common-anode laser diode and common-cathode laser diode. Shown in FIG. 22 are the laser diode 11, which is of common-anode or common-cathode type, the ACC circuit 12 for performing control in such a manner that the laser diode current attains a set value, the ATC circuit 13 for performing control in such a manner that the laser diode temperature is rendered constant, and the optical fiber 14. Numeral 16 denotes the laser diode current limiting circuit which, when elapsed time from introduction of power has not attained a set time, halts ACC control and limits laser diode current, and, when elapsed time from introduction of power has attained the set time, restores ACC control and makes the laser diode current equal to the set value. Numeral 31 denotes the elapsed-time monitor circuit 31 for monitoring time that elapses from introduction of power. For example, the elapsed-time monitor circuit 31 is constituted by a delay circuit (integrator circuit) in which output voltage $V_L$ increases as time elapses from the moment power is introduced.

The laser diode current limiting circuit 16 includes the reference voltage generator 16a for outputting the reference voltage Vr conforming to a set temperature, the comparator 16b for comparing the voltage $V_L$, which conforms to elapsed time, with the reference voltage Vr, the limit-current controller 16c for outputting a constant limit current $i_L$ when elapsed time has not attained the set value and for making the limit current zero when the elapsed time has exceeded the set time, the laser-diode type detector 16d for detecting whether the laser diode 11 is of the common-anode type or common-cathode type, and the limit-current direction changeover unit 16e, to which the limit current $i_L$ is applied, for performing control in such a manner that (1) when the laser diode 11 is of the common-anode type, the limit current flows into the ACC circuit 12, and (2) when the laser diode 11 is of the common-cathode type, a current equivalent to the limit current flows out of the ACC circuit 12.

As described above in connection with FIG. 15, the common-anode ACC circuit 12 is such that the limit current $i_L$ is caused to flow into the resistor R1, thereby enlarging the terminal voltage of the resistor R1 and limiting the laser diode current. On the other hand, the common-cathode ACC circuit 12' is such that some (the limit current $i_L$) of the current that flows through the resistor R4 is caused to flow to the outside without passing through the laser diode, thereby limiting the laser diode current.

Accordingly, the shared laser diode current limiting circuit 16 performs control in such a manner that the limit current $i_L$ is caused to flow into the ACC circuit if the ACC circuit is of the common-anode type, and in such a manner that the ACC circuit splits the limit current if the ACC circuit is of the common-cathode type.

(d) Circuit details of part of shared laser diode current limiting circuit

Figure 23:
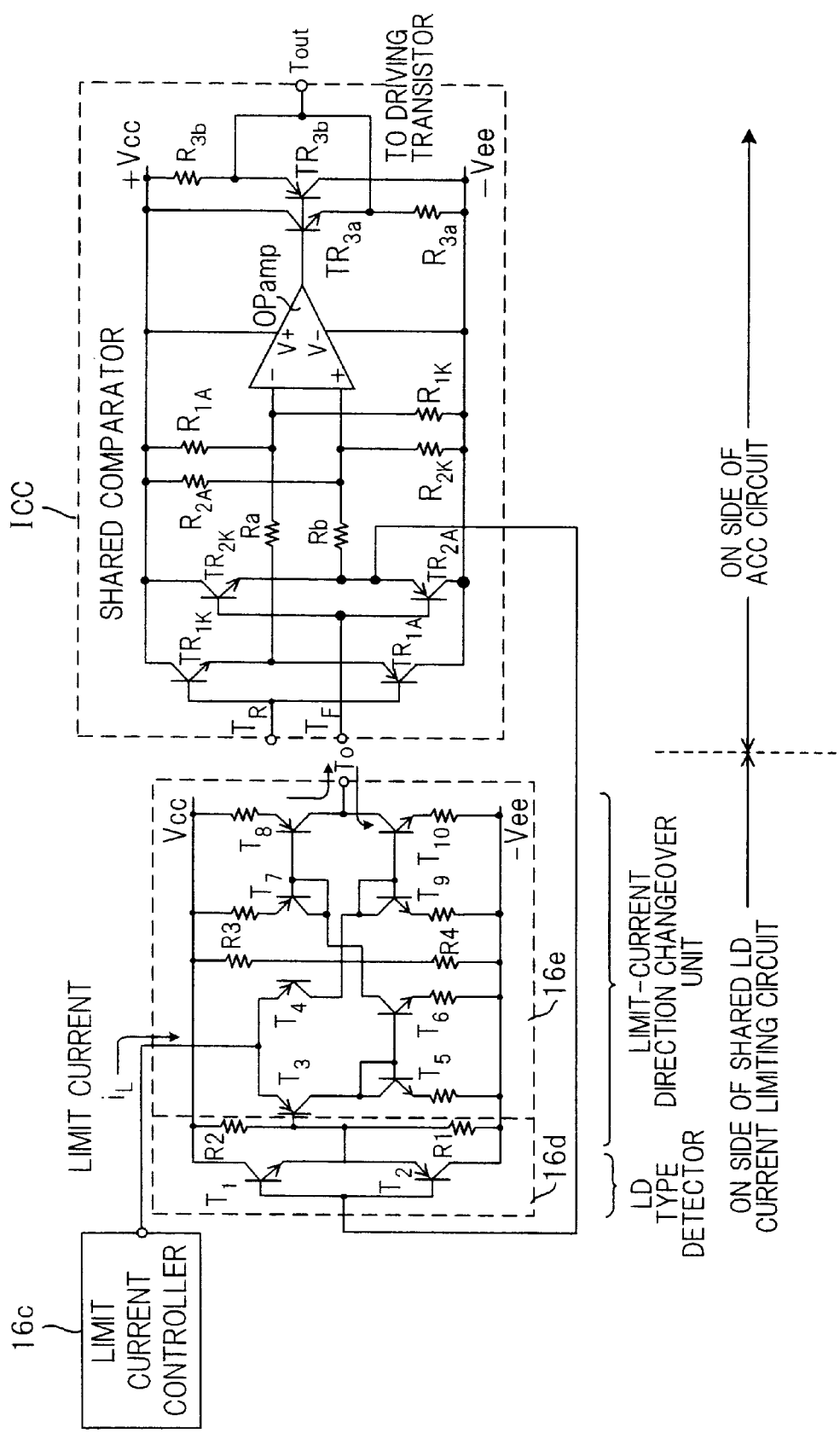
FIG. 23 is a detailed circuit diagram of part of a shared laser diode current limiting circuit.
Figure 24A:
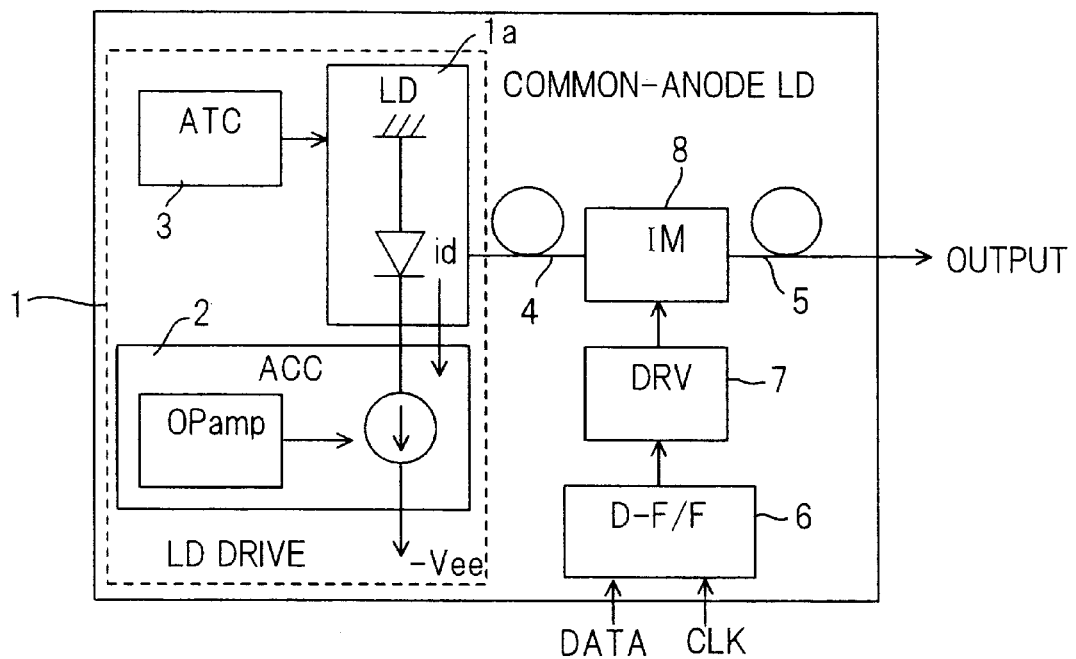
FIGS. 24A, 24B are block diagrams of optical transmitters.
Figure 24B:
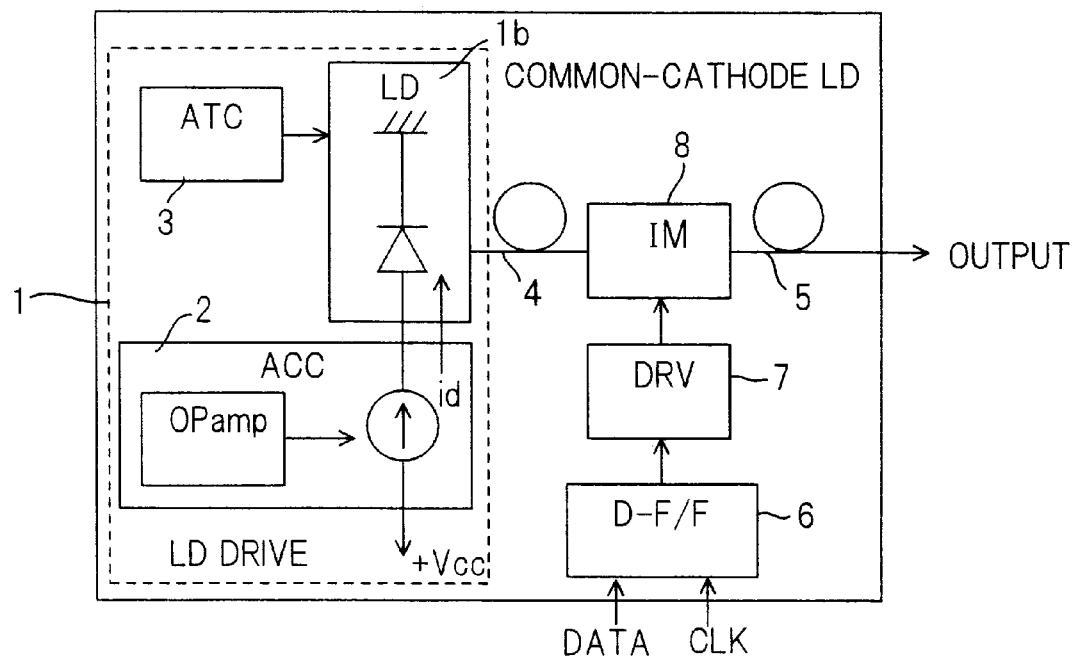

FIG. 23 is a detailed circuit diagram of part of the shared laser diode current limiting circuit 16 (FIGS. 20 to 22) and illustrates the details of the laser-diode type detector 16d and limit-current direction changeover unit 16e.

(d-1) Laser-diode type detector

The laser-diode type detector 16d is constituted by a complementary emitter follower circuit. More specifically, two transistors $T_1$, $T_2$ of different polarities have their emitters connected together as well as their bases, the collector of the npn transistor $T_1$ is connected to the positive power source +Vcc, the collector of the pnp transistor $T_2$ is connected to the negative power source –Vee, and a positive or negative input signal is applied to the bases of these transistors. When a signal having positive polarity is input to the bases, the npn transistor $T_1$ turns on and the pnp transistor $T_2$ turns off, thereby constructing an emitter follower circuit of gain 1, in which the resistor $R_1$ serves as the emitter resistor. An output signal of positive polarity having the same amplitude as that of the input signal enters the limit-current direction changeover unit 16e, which is the next stage. When a signal having negative polarity is input to the bases, the npn transistor $T_1$ turns off and the pnp transistor $T_2$ turns on, thereby constructing an emitter follower circuit of gain 1, in which the resistor $R_2$ serves as the emitter resistor. An output signal of negative polarity having the same amplitude as that of the input signal enters the limit-current direction changeover unit 16e, which is the next stage.

In actuality, the output signal of the first or second emitter follower circuit of the shared comparator ICC enters the bases of the laser-diode type detector 16d. When the shared comparator ICC is used in the ACC circuit of the common-anode laser diode, the first or second emitter follower circuit inputs a signal of negative polarity to the bases of the laser-diode type detector 16d. The laser-diode type detector, therefore, inputs a signal of negative polarity to the limit-current direction changeover unit 16e if the laser diode is of common-anode type. When the shared comparator ICC is used in the ACC circuit of the common-cathode laser diode, the first or second emitter follower circuit inputs a signal of positive polarity to the bases of the laser-diode type detector 16d. The laser-diode type detector, therefore, inputs a signal of positive polarity to the limit-current direction changeover unit 16e if the laser diode is of common-cathode type.

(d-2) Limit-current direction changeover unit

The limit-current direction changeover unit 16e has transistors $T_3$, $T_4$ constructing a differential pair. The output signal of the laser-diode type detector 16d enters one transistor $T_3$ and a constant voltage obtained through voltage division by resistors R3, R4 enters the base of the other transistor $T_4$. This differential pair passes the limit current $i_L$, which is output by the limit-current controller 16c, into the transistor having the smaller base voltage. Transistors $T_5$, $T_6$ construct a first current mirror circuit, transistors $T_7$, $T_8$ a second current mirror circuit and transistors $T_9$, $T_{10}$ a third current mirror circuit. An output terminal $T_0$ is connected to a feedback-voltage input terminal $T_F$ of the shared comparator ICC constructing the ACC circuit and to the resistor R1 (in case of the common-anode type) or resistor R4 (in case of the common-cathode type).

(d-3) Operation

Since the laser-diode type detector 16d outputs a signal of negative polarity if the laser diode is of the common-anode type, the transistor $T_3$ turns on and the limit current $i_L$ flows through the transistor $T_5$. The limit current $i_L$ flows through the transistors $T_6$, $T_7$ owing to the first current mirror, and the limit current flows into the transistor $T_8$ owing to the second current mirror. More specifically, if the laser diode is of the common-anode type, the limit current $i_L$ flows into the resistor R1 of the ACC circuit. On the other hand, since the laser-diode type detector 16d outputs a signal of positive polarity if the laser diode is of the common-cathode type, the transistor $T_4$ turns on, the limit current $i_L$ flows through the transistor $T_9$ and the limit current $i_L$ flows through the transistor $T_{10}$ owing to the third current mirror. More specifically, if the laser diode is of the common-cathode type, the limit current $i_L$ flows out of the ACC circuit.

Thus, in accordance with the present invention, the power (backward power) of a laser diode is monitored and the laser diode current is limited when the backward power exceeds a set value. When the laser diode temperature subsequently rises and the backward power falls below the set power, automatic current control is applied so that the laser diode will take on a set current value. As a result, the laser diode current can be limited when the laser diode is at a low temperature. This makes it possible to prevent an excessive light emission from the laser diode so that the laser diode will not destroyed or suffer a deterioration in characteristics.

In accordance with the present invention, laser diode temperature is monitored and the laser diode current is limited when the laser diode temperature is less than a set temperature. When the laser diode temperature rises and surpasses the set temperature, automatic current control is applied so that the laser diode will take on the set current value. As a result, an excessive emission from the laser diode at low temperature can be prevented. This assures that neither damage to the laser diode nor deterioration of the laser diode characteristics will occur.

In accordance with the present invention, time that elapses from introduction of power is monitored. If the elapsed time has not exceeded a set time, the laser diode current is limited to zero or to a low current value. After the elapsed time exceeds the set time, automatic current control is applied so that the laser diode current will become equal to the set current value. As a result, the set time is made the time required for the laser diode temperature to attain a substantially constant temperature after power is introduced (i.e., the time needed for the laser diode temperature to stabilize). As a result, the laser diode current is limited when the laser diode is at a low temperature. This makes it possible to prevent an excessive emission of light from the laser diode and assure that neither damage to the laser diode nor deterioration of the laser diode characteristics will occur.

In accordance with the present invention, common use is made of a comparator (current control circuit) employed in ACC circuits of both the common-anode and common-cathode types. This has the effect of lowering cost.

In accordance with the present invention, a laser diode protecting circuit for preventing an excessive emission from a laser diode can be used commonly for laser diodes of both the common-anode and common-cathode types. This also has the effect of lowering cost.

As many apparently widely different embodiments of the present invention can be made without departing from the spirit and scope thereof, it is to be understood that the invention is not limited to the specific embodiments thereof except as defined in the appended claims.

What is claimed is:

1. A laser driving current control circuit in which a laser diode of common-anode type or common-cathode type, a semiconductor switch and a resistor are connected in series, and feedback control is performed in such a manner that terminal voltage produced across the resistor by a laser driving current will become equal to a set voltage, whereby the laser driving current is made to attain a set value, comprising:

a first emitter follower circuit in which semiconductor elements having different polarities are connected complementarily, an emitter follower is constructed regardless of which semiconductor element turns on, and the set voltage is input thereto;

a second emitter follower circuit in which semiconductor elements having different polarities are connected complementarily, an emitter follower is constructed regardless of which semiconductor element turns on, and a feedback voltage conforming to the terminal voltage is input thereto;

an attenuator for attenuating output voltages of the first and second emitter follower circuits;

an operational amplifier in which the set voltage and the feedback voltage, which have been attenuated by said attenuator, are input to an inverting input terminal and a non-inverting input terminal, respectively, for outputting a signal which turns the semiconductor switch on/off based upon the sizes of both voltage signals; and a third emitter follower circuit in which semiconductor elements having different polarities are connected complementarily, an emitter follower is constructed regardless of which semiconductor element turns on, and the output signal of the operational amplifier is input thereto;

said semiconductor switch being turned on/off by the output signal of said third emitter follower circuit.

2. A laser diode protecting circuit having an automatic current control circuit for performing control in such a manner a laser diode current attains a set current value, a power monitor circuit for monitoring emission power of a laser diode, and a laser diode current limiting circuit for halting automatic current control and limiting laser diode current when the emission power exceeds a set value, and restoring automatic current control to make the laser diode current equal to the set current value when the emission power falls below the set value, said automatic current control circuit comprising:

a series circuit in which a laser diode of common-anode type or common-cathode type, a semiconductor switch and a resistor are connected in series and inserted between a power source and ground;

a first emitter follower circuit in which semiconductor elements having different polarities are connected complementarily, an emitter follower is constructed regardless of which semiconductor element turns on, and the set voltage is input thereto;

a second emitter follower circuit in which semiconductor elements having different polarities are connected complementarily, an emitter follower is constructed regardless of which semiconductor element turns on, and terminal voltage produced across the resistor by the laser diode current is input thereto as feedback voltage;

an attenuator for attenuating output voltages of the first and second emitter follower circuits;

an operational amplifier in which the set voltage and the feedback voltage, which have been attenuated by said attenuator, are input to an inverting input terminal and a non-inverting input terminal, respectively, for outputting a signal which turns the semiconductor switch on/off based upon the sizes of both voltage signals; and a third emitter follower circuit in which semiconductor elements having different polarities are connected complementarily, an emitter follower is constructed regardless of which semiconductor element turns on, and the output signal of the operational amplifier is input thereto;

said semiconductor switch being turned on/off by the output signal of said third emitter follower circuit.

3. The circuit according to claim 2, wherein said laser diode current limiting circuit includes:

a laser-diode type detector for detecting whether the laser diode is of the common-anode type or common-cathode type based upon an output voltage value from said first or second emitter follower circuit;

a comparator circuit for comparing emission power and the set value;

a limit-current controller for outputting a constant limit current when emission power surpasses the set value and for making the limit current zero when the emission power falls below the set value; and a limit-current direction changeover unit, to which the limit current is applied, for performing control based upon the type of laser diode in such a manner that the limit current flows into said resistor via a feedback voltage input terminal of said second emitter follower circuit or a current equivalent to the limit current flows out of said resistor via said feedback voltage input terminal.

4. A laser diode protecting circuit having an automatic current control circuit for performing control in such a manner a laser diode current attains a set current value, a power monitor circuit for monitoring emission power of a laser diode, and a laser diode current limiting circuit for halting automatic current control and limiting laser diode current when the emission power exceeds a set value, and restoring automatic current control to make the laser diode current equal to the set current value when the emission power falls below the set value, wherein said automatic current control circuit comprises:

a series circuit in which a laser diode of common-anode type or common-cathode type, a semiconductor switch and a resistor are connected in series and inserted between a power source and ground; and a control circuit for controlling the semiconductor switch in such a manner that terminal voltage of the resistor will attain a set voltage, whereby the laser diode current is made to attain a set current value; and said laser diode current limiting circuit comprises:

a laser-diode type detector for detecting whether the laser diode is of the common-anode type or common-cathode type;

a comparator circuit for comparing emission power and the set value;

a limit-current controller for outputting a limit current conforming to optical power when emission power surpasses the set value and for making the limit current zero when the emission power falls below the set value; and a limit-current direction changeover unit, to which the limit current is applied, for passing the limit current into said resistor of the automatic current control circuit if the laser diode is of the common-anode type and causing a current equivalent to the limit current to flow out of said resistor if the laser diode is of the common-cathode type.

5. A laser diode protecting circuit having an automatic current control circuit for performing control in such a manner a laser diode current attains a set current value, a temperature monitor circuit for monitoring temperature of a laser diode, and a laser diode current limiting circuit for halting automatic current control and limiting laser diode current when the temperature of the laser diode exceeds a set temperature, and restoring automatic current control to make the laser diode current equal to the set current value when the laser diode temperature falls below the set temperature, said automatic current control circuit comprising:

a series circuit in which a laser diode of common-anode type or common-cathode type, a semiconductor switch and a resistor are connected in series and inserted between a power source and ground; and a first emitter follower circuit in which semiconductor elements having different polarities are connected complementarily, an emitter follower is constructed regardless of which semiconductor element turns on, and the set voltage is input thereto;

a second emitter follower circuit in which semiconductor elements having different polarities are connected complementarily, an emitter follower is constructed regardless of which semiconductor element turns on, and terminal voltage of the resistor is input thereto as feedback voltage;

an attenuator for attenuating output voltages of the first and second emitter follower circuits;

an operational amplifier in which the set voltage and the feedback voltage, which have been attenuated by said attenuator, are input to an inverting input terminal and a non-inverting input terminal, respectively, for outputting a signal which turns the semiconductor switch on/off based upon the sizes of both voltage signals; and a third emitter follower circuit in which semiconductor elements having different polarities are connected complementarily, an emitter follower is constructed regardless of which semiconductor element turns on, and the output signal of the operational amplifier is input thereto;

said semiconductor switch being turned on/off by the output signal of said third emitter follower circuit.

6. The circuit according to claim 5, wherein said laser diode current limiting circuit includes:

a laser-diode type detector for detecting whether the laser diode is of the common-anode type or common-cathode type based upon an output voltage value from said first or second emitter follower circuit;

a comparator circuit for comparing laser diode temperature and the set temperature;

a limit-current controller for outputting a limit current conforming to laser diode temperature when the laser diode temperature is less than the set temperature and for making the limit current zero when the laser diode temperature is greater than the set temperature; and a limit-current direction changeover unit, to which the limit current is applied, for performing control based upon the type of laser diode in such a manner that the limit current flows into said resistor via a feedback voltage input terminal of said second emitter follower circuit or a current equivalent to the limit current flows out of said resistor via said feedback voltage input terminal.

7. A laser diode protecting circuit having an automatic current control circuit for performing control in such a manner a laser diode current attains a set current value, a temperature monitor circuit for monitoring temperature of a laser diode, and a laser diode current limiting circuit for halting automatic current control and limiting laser diode current when the temperature of the laser diode falls below a set temperature, and restoring automatic current control to make the laser diode current equal to the set current value when the laser diode temperature exceeds the set temperature, wherein said automatic current control circuit comprises:

a series circuit in which a laser diode of common-anode type or common-cathode type, a semiconductor switch and a resistor are connected in series and inserted between a power source and ground; and a control circuit for controlling the semiconductor switch in such a manner that terminal voltage of the resistor will attain a set voltage, whereby the laser diode current is made to attain a set current value; and said laser diode current limiting circuit comprises:

a laser-diode type detector for detecting whether the laser diode is of the common-anode type or common-cathode type;

a comparator circuit for comparing laser diode temperature and the set temperature;

a limit-current controller for outputting a constant limit current when the laser diode temperature is greater than the set temperature and for making the limit current zero when the laser diode temperature is greater than the set temperature; and a limit-current direction changeover unit, to which the limit current is applied, for passing the limit current into said resistor of the automatic current control circuit if the laser diode is of the common-anode type and causing a current equivalent to the limit current to flow out of said resistor if the laser diode is of the common-cathode type.

8. A laser diode protecting circuit having an automatic current control circuit for performing control in such a manner a laser diode current attains a set current value, an elapsed-time monitor circuit for monitoring time that elapses from introduction of power, and a laser diode current limiting circuit for halting automatic current control and limiting laser diode current when time that elapses from introduction of power has not attained a set time, and restoring automatic current control to make the laser diode current equal to the set current value when the time that elapses from introduction of power has attained the set time, said automatic current control circuit comprising:

a series circuit in which a laser diode of common-anode type or common-cathode type, a semiconductor switch and a resistor are connected in series and inserted between a power source and ground; and a first emitter follower circuit in which semiconductor elements having different polarities are connected complementarily, an emitter follower is constructed regardless of which semiconductor element turns on, and the set voltage is input thereto;

a second emitter follower circuit in which semiconductor elements having different polarities are connected complementarily, an emitter follower is constructed regardless of which semiconductor element turns on, and terminal voltage of the resistor is input thereto as feedback voltage;

an attenuator for attenuating output voltages of the first and second emitter follower circuits;

an operational amplifier in which the set voltage and the feedback voltage, which have been attenuated by said attenuator, are input to an inverting input terminal and a non-inverting input terminal, respectively, for outputting a signal which turns the semiconductor switch on/off based upon the sizes of both voltage signals; and a third emitter follower circuit in which semiconductor elements having different polarities are connected complementarily, an emitter follower is constructed regardless of which semiconductor element turns on, and the output signal of the operational amplifier is input thereto;

said semiconductor switch being turned on/off by the output signal of said third emitter follower circuit.

9. The circuit according to claim 8, wherein said laser diode current limiting circuit includes:

a laser-diode type detector for detecting whether the laser diode is of the common-anode type or common-cathode type based upon an output voltage value from said first or second emitter follower circuit;

a comparator circuit for comparing elapsed time and the set time;

a limit-current controller for outputting a constant limit current when the elapsed time has not attained the set time and for making the limit current zero when the elapsed time has exceeded the set time; and a limit-current direction changeover unit, to which the limit current is applied, for performing control based upon the type of laser diode in such a manner that the limit current flows into said resistor via a feedback voltage input terminal of said second emitter follower circuit or a current equivalent to the limit current flows out of said resistor via said feedback voltage input terminal.

10. A laser diode protecting circuit having an automatic current control circuit for performing control in such a manner a laser diode current attains a set current value, an elapsed-time monitor circuit for monitoring time that elapses from introduction of power, and a laser diode current limiting circuit for halting automatic current control and limiting laser diode current when time that elapses from introduction of power has not attained a set time, and restoring automatic current control to make the laser diode current equal to the set current value when the time that elapses from introduction of power has attained the set time, wherein said automatic current control circuit comprises:

a series circuit in which a laser diode of common-anode type or common-cathode type, a semiconductor switch and a resistor are connected in series and inserted between a power source and ground; and a control circuit for controlling the semiconductor switch in such a manner that terminal voltage of the resistor will attain a set voltage, whereby the laser diode current is made to attain a set current value; and said laser diode current limiting circuit comprises:

a laser-diode type detector for detecting whether the laser diode is of the common-anode type or common-cathode type;

a comparator circuit for comparing elapsed time and the set time;

a limit-current controller for outputting a constant limit current when the elapsed time has not attained the set time and for making the limit current zero when the elapsed time has exceeded the set time; and a limit-current direction changeover unit, to which the limit current is applied, for passing the limit current into said resistor of the automatic current control circuit if the laser diode is of the common-anode type and causing a current equivalent to the limit current to flow out of said resistor if the laser diode is of the common-cathode type.

* * * * *